United States Patent
Shestopalov et al.

(10) Patent No.: US 9,899,212 B2
(45) Date of Patent: Feb. 20, 2018

(54) METHODS FOR DEPOSITING A MONOLAYER ON A SUBSTRATE

(71) Applicant: The University of Rochester, Rochester, NY (US)

(72) Inventors: Alexander Shestopalov, Rochester, NY (US); James McGrath, Fairport, NY (US); Xunzhi Li, Rochester, NY (US)

(73) Assignee: The University of Rochester, Rochester, NY (US)

( * ) Notice: Subject to any disclaimer, the term of this patent is extended or adjusted under 35 U.S.C. 154(b) by 0 days.

(21) Appl. No.: 15/130,208

(22) Filed: Apr. 15, 2016

(65) Prior Publication Data

US 2016/0307747 A1    Oct. 20, 2016

Related U.S. Application Data

(60) Provisional application No. 62/149,152, filed on Apr. 17, 2015.

(51) Int. Cl.
| | |
|---|---|
| *H01L 21/31* | (2006.01) |
| *H01L 21/02* | (2006.01) |
| *C23C 16/00* | (2006.01) |
| *C23C 16/48* | (2006.01) |

(52) U.S. Cl.
CPC .......... *H01L 21/0228* (2013.01); *C23C 16/00* (2013.01); *C23C 16/482* (2013.01); *H01L 21/02112* (2013.01)

(58) Field of Classification Search
CPC ............................ H01L 21/0228; C23C 16/00
USPC ....................................................... 438/767
See application file for complete search history.

(56) References Cited

U.S. PATENT DOCUMENTS

| 4,987,032 A * | 1/1991 | Miyasaka | .......... B01D 67/0093 |
| | | | 204/157.6 |
| 2004/0081384 A1* | 4/2004 | Datesman | ............ G01N 21/431 |
| | | | 385/12 |
| 2006/0046261 A1* | 3/2006 | Porter | ...................... C07K 1/36 |
| | | | 435/6.12 |

(Continued)

FOREIGN PATENT DOCUMENTS

| EP | 2966118 A1 | 1/2016 |
| WO | 2009104180 A1 | 8/2009 |

OTHER PUBLICATIONS

Wei et al., Grafting Organic and Biomolecules on H-Terminated Porous Silicon from a Diazirine, Chemistry Letters, 2006, vol. 35, pp. 1172-1173 and Supporting Information.

(Continued)

*Primary Examiner* — Caleb Henry
(74) *Attorney, Agent, or Firm* — Meunier Carlin & Curfman LLC

(57) ABSTRACT

Methods and compositions for depositing a monolayer onto a surface of a substrate are described. The method can include contacting the surface with a vapor phase comprising a carbene source, and reacting a carbene group from the carbene source with a functional group on the surface, to obtain a covalently bound monolayer on the surface of the substrate. The carbene source can be a diazirine compound. The functional group on the surface can be a C—H containing group, a Si—H containing group, among others, or combinations thereof. The method can further involve removing physisorbed molecules from the surface of the substrate.

22 Claims, 16 Drawing Sheets

(56) References Cited

U.S. PATENT DOCUMENTS

| | | | | |
|---|---|---|---|---|
| 2008/0171087 A1* | 7/2008 | Chappa | ............ | A61L 29/06 424/486 |
| 2010/0068783 A1* | 3/2010 | Moloney | ............ | C03C 17/28 435/177 |
| 2014/0049823 A1* | 2/2014 | Grubbs | ............ | G02B 1/04 359/489.01 |
| 2014/0275555 A1* | 9/2014 | Johnson | ............ | C07D 233/20 548/255 |
| 2016/0289248 A1* | 10/2016 | Johnson | ............ | C07F 7/0827 |

OTHER PUBLICATIONS

Puniredd et al., Highly Stable Organic Monolayers for Reacting Silicon with Further Functionalities: The Effect of the C—C Bond Nearest the Silicon Surface, JACS, 2008, vol. 130, pp. 13727-13734.

Assad et al., Stable Scaffolds for Reacting Si Nanowires with Further Organic Functionalities while Preserving Si—C Passivation of Surface Sites, JACS, 2008, vol. 130, pp. 17670-17671.

Gerard et al., Surface Modification of Poly(butylene terephthalate) Nonwoven by Photochemistry and Biofunctionalization with Peptides for Blood Filtration, Journal of Polymer Science Part A: Polymer Chemistry, 2011, pp. 5087-5099.

Shestopalov et al., Soft-Lithographic Approach to Functionalization and Nanopatterning Oxide-Free Silicon, Langmuir, 2011, pp. 6478-6485.

Morris et al., Patterning NHS-Terminated SAMs on Germanium, Langmuir, 2011, vol. 27, pp. 6486-6489.

Bowers et al., A General and Efficient Cantilever Functionalization Technique for AFM Molecular Recognition Studies, Biopolymers, 2012, vol. 97, Issue 10, pp. 761-765.

Bowers et al., Multicomponent Patterning of Indium Tin Oxide, ACS Applied Materials & Interfaces, 2012, vol. 4, pp 3932-3937.

Bowers et al., Structural Modifications in Bilayered Molecular Systems Lead to Predictable Changes in Their Electronic Properties, Advanced Materials Interfaces, 2014, pp. 1-7.

* cited by examiner

METHODS FOR DEPOSITING A MONOLAYER ON A SUBSTRATE

CROSS REFERENCE TO RELATED APPLICATIONS

This application claims the benefit of U.S. Provisional Application No. 62/149,152, filed Apr. 17, 2015, which is incorporated herein by reference in its entirety.

FIELD

This disclosure relates generally to methods of depositing a monolayer on a substrate.

BACKGROUND

Depositing a single monomolecular layer on material surfaces has been the subject of numerous investigations. The importance of such technology spans multiple disciplines, including heterogeneous catalysis, material separation and filtration, functionalization of polymers with monomolecular coatings, and electronics. One approach to forming monomolecular layers includes formation of chemisorbed organic monolayers, which relies on the chemical reaction between the activated surface and the reactive organic molecule. To form a stable monomolecular layer, the reaction must be complete, functionalizing all reactive surface sites, and form thermodynamically stable and non-hydrolytic surface bonds. Activated but only partially reacted surfaces readily interact with adventurous molecules, for example via van der Waals forces or chemical reactions. This causes monolayer contamination and/or degradation of hydrolytic surface bonds, even if they are thermodynamically stable.

One approach to achieve both complete surface coverage and stable attachment of a monolayer includes self-assembled monolayers (SAMs). SAMs utilizes molecules with symmetrical structures that can form ordered two-dimensional organic phases stabilized by the extensive van der Waals interactions. SAMs have been successfully applied on many flat inorganic surfaces, but was never successfully extended to rough interfaces. Typically, interfaces with roughness' comparable to or greater than the monolayer thickness (e.g., ~2-10 nm) have disrupted two-dimensional van der Waals interactions and disordered organic phases. SAMs have also never been successfully extended to soft materials. The majority of soft materials (polymers and functional thin films) are too inert and their activation requires the use of chemicals, solvents or charged plasma species that degrade, dissolve or etch the material. The SAM approach also imposes several requirements on the symmetry and size of the molecules used to form the monolayer. For example, monolayers bearing large terminal functional groups are generally unstable due to the relatively low order in the organic phase resulting from steric constraints induced by the terminal functionality. In contrast, simple aliphatic thiols, silanes, and phosphonic acids form highly ordered and stable SAMs on metals and oxides that act as impervious barriers to organic and aqueous solutions. However such ordered monolayers are too inert and not amenable to traditional functionalization protocols to carry out a needed function. Self-assembly also precludes formation of uniformly mixed multicomponent monolayers. Literature examples show that even a ~5 kcal/mol difference in the van der Waals stabilization energy of two different molecules leads to their phase segregation into distinctive mono-component domains when they are co-deposited together from the same solution. For example, co-deposition of homologous molecules (e.g., unbranched aliphatic thiols that differ in length only by 3 methylene units) results in a monolayer surface composition that does not correlate with the solution concentrations due to the preferential adsorption of molecules with stronger van der Waals interactions. This essentially precludes formation of any uniform multicomponent monolayers that have slightly different components.

Functionalization of chemically inert surfaces by attaching organic molecules via stable non-polar bonds have been reported. For example, stable H-terminated diamond, carbon nanotube and graphene sheets can react with organic alkenes and alkynes to form stable monolayers that are connected to the surface through $C-CH_2$ and $C-CH$ bonds. However, the formation of such monolayers relies on harsh hydroalkylation reactions that typically require chemical catalysis, specific solvents or high temperatures—conditions incompatible with many inorganic substrates, let alone with organic polymers and thin films.

There is a need for methods of depositing stable functional monolayers on inert supports that do not change in ambient or mild reactive environments. There is also a need for depositing a uniform monomolecular film whose packing densities are determined only by the molecular sizes and not by the intermolecular van der Waals interactions. There is also a need for monolayers that are free of conformational or pinhole defects. The compositions and methods disclosed herein address these and other needs.

SUMMARY

Methods and compositions for depositing a monolayer onto a surface of a substrate are described herein. The methods can include contacting the surface with a vapor phase comprising a carbene source, and generating a carbene group from the carbene source, which then reacts with the surface, to obtain a covalently bound monolayer on the surface of the substrate. In some aspects, the reaction is free or substantially free of a solvent.

The carbene source can be any suitable compound selected from a carbene group containing compound, a carbene precursor, and combinations thereof. When the carbene source is a carbene precursor, the method can include reacting the carbene precursor to produce a carbene group. The carbene precursor can react, for example, by decomposition or with a molecule to generate the carbene group. In some aspects, the method can include irradiating the carbene precursor to generate a carbene group.

In some aspects, the carbene precursor can be represented by the formula:

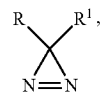

wherein R and $R^1$ can be independently selected from the group consisting of hydrogen, halogen, hydroxyl an alkylhalide, substituted or unsubstituted $C_1$ to $C_{30}$ alkyl, substituted or unsubstituted aryl (for e.g., phenyl, naphthyl, or anthracenyl), an amide, an ester, substituted or unsubstituted alkylaryl, substituted or unsubstituted heteroaryl (for e.g., pyridine, pyrimidine), alkoxyl, aryloxyl, sulfhydryl, cyano, cyanato, thiocyanato, amino, nitro, nitroso, sulfo, sulfonato, boryl, borono, phosphono, phosphonato, phosphinato, phospho, phosphino, siloxy, or combinations thereof. In certain examples, R is $C_1$-$C_6$ alkyl, $C_1$-$C_6$ alkylhalide, substituted or unsubstituted aryl, substituted or unsubstituted heteroaryl, $C_1$-$C_6$ alkoxyl, aryloxyl, amino, amido, substituted or unsubstituted cycloalkyl, substituted or unsubstituted heterocycloalkyl, cyano, cyanato, ester, hydro, halo, thiocyanato, nitro, nitroso, sulfo, sulfonato, thio, boryl, borono, phosphono, phosphonato, phosphinato, phospho, phosphino, silyl, or siloxyl; and $R^1$ is $C_1$-$C_6$ alkylhalide, substituted or unsubstituted aryl, substituted or unsubstituted heteroaryl, $C_1$-$C_6$ alkoxyl, aryloxyl, amino, amido, substituted or unsubstituted cycloalkyl, substituted or unsubstituted heterocycloalkyl, cyano, cyanato, ester, hydro, halo, thiocyanato, nitro, nitroso, sulfo, sulfonato, thio, boryl, borono, phosphono, phosphonato, phosphinato, phospho, phosphino, silyl, or siloxyl; wherein when R or $R^1$ is chosen from a substituted substituent it is substituted with sulfonic acid, sulfonate, amino, amido, alkyl, alkenyl, alkynyl, alkoxyl, aryl, carbonyl, carboxylate, carbamyl, cyano, ester, halogen, heteroaryl, hydroxyl, nitrile, nitro, sulfinyl, sulfanyl, or thiol. In some examples, R can be selected from a halo, methyl, or a trihalomethyl; and $R^1$ can be selected from a substituted or unsubstituted aryl or a substituted or unsubstituted heteroaryl. In a specific example, the carbene source can include an ester, an amide, a carbamate, or a succinimide (such as N-hydroxysuccinimide) functional group.

The surface of the substrate contains a functional group, which reacts with the carbene group. The functional group can be any suitable functional group reactive with the carbene group. In some examples, the functional group can be selected from a C—H containing group, a Si—H containing group, and combinations thereof. In other examples, the functional group can be selected from a —$NH_2$, OH, and SH group, and combinations thereof. In some aspects, the surface can comprise an organic material such as an organic small molecule or an organic polymeric material, an inorganic material, or a combination thereof. In some examples, the organic polymeric material can comprise a polymer selected from the group consisting of polyolefins, polyesters, polyamides, polystyrenics, polytetrafluoroethylene, polyglycosides, polypeptides, polyacrylates, polyacrylics, polycarbonates, polyethers, polyketones, rubbers, polysulfones, polyurethanes, polyvinyls, polysaccharides, polysilanes, polysiloxanes, polydimethyl silanes, and combinations thereof. In still further examples, the surface can comprise a small organic molecule such as a $C_1$-$C_{20}$ alkyl, a $C_2$-$C_{20}$ alkenyl, a $C_2$-$C_{20}$ alkynyl, or a combination thereof. In some examples, the organic material is a semiconducting organic polymer or a semiconducting organic small molecule. In some examples, the inorganic material can comprise group II, III, IV, V semiconductors (e.g., Si, C, SiC, Ge, GaAs, GaN, CdTe, CdS, CdSe, and the like). In other examples, the inorganic material can comprise conductive oxides (e.g., molybdenum oxide, tungsten oxide, ruthenium oxide, iron oxide, iridium oxide, chromium oxide, manganese oxide, tin oxide, cobalt oxide, nickel oxide, indium tin oxide (ITO), aluminum zinc oxide (AZO), indium zinc oxide (IZO), and cadmium stannic oxide (CdSnO)). In still other examples, the inorganic material can comprise silicon, silicon nitride, silicon oxinitride, alumina, titania, glass, an allotrope of carbon, or combinations thereof. In some examples, the substrate includes polyurethane acrylate, indium-tin-oxide, silicon nitride, or methylated silicon.

In some aspects, the method can include providing the functional group on the surface. For example, the surface can be coated with a film, the film comprising a functional group reactive with the carbene group. The functional group can be any one or more of the functional groups described herein. In some examples, the film can be a self-assembled monolayer. In some examples, the film can be a thin film of organic molecules including for example, an organic monolayer or an organic multilayer. In some examples, the method can include reacting the surface with a compound to obtain a functional group reactive with the carbene group.

As discussed above, the carbene source is present in a vapor phase. The vapor phase can be at a temperature of from about 0° C. to about 500° C., for example from about 20° C. to about 300° C. or about 100° C. to about 150° C. The particular temperature can be adjusted depending on the particular application, and can be influenced by the pressure. For example, lower temperatures, which can avoid decomposition, can be used with higher pressures. The vapor phase can be at a vapor pressure of from about $10^{-2}$ to about $10^{-9}$ Torr or greater. For example, the vapor pressure can be about $10^{-2}$, $10^{-3}$, $10^{-4}$, $10^{-5}$, $10^{-6}$, $10^{-7}$, 10–8, or $10^{-9}$ Torr. In some cases, an inert carrier gas like $N_2$, Ar, or He can be used to contact the surface with the vapor phase.

The method can further comprise removing physisorbed molecules from the surface of the substrate. In some examples, the physisorbed molecules can be removed by rinsing the surface with a solvent, heating the surface in a vacuum, exposing the surface to a high vacuum, or combinations thereof. The rinsing solvent can be selected from water, carbon tetrachloride, chloroform, dichloromethane, ethanol, isopropanol, acetone, hexane, THF, DMF, DMSO, and combinations thereof.

In some aspects, the covalently bound monolayer can have a thickness of 20 nm or less.

The method can further comprise reacting the covalently bound monolayer obtained with an organic or inorganic compound. In some examples, the covalently bound monolayer can be reacted with an organic small molecule, a polymeric group, or an inorganic material. In some aspects, the polymeric group can be a modified polyethylene glycol group.

Methods for depositing a mixed-monolayer onto a surface of a substrate are also described herein. The method can include contacting the surface with a mixed vapor phase comprising two or more carbene sources, and reacting two or more carbene groups from the two or more carbene sources with functional groups on the surface to obtain a covalently bound mixed-monolayer on the surface of the substrate. For example, an inert carrier gas like $N_2$, Ar, or He can be used to control the ratio of molecules in the vapor phase. Thus, a carrier gas can be used to contact the surface with the mixed vapor phase. Also, the carbenes can be evaporated from the two carbene different sources at to two different temperatures. The carbene sources can be in a ratio of from 1:1 to 1:1000 such as from 1:10 to 1:100. In some examples, the carbene sources can be in a ratio of 1:1.

BRIEF DESCRIPTION OF THE FIGURES

The accompanying figures, which are incorporated in and constitute a part of this specification, illustrate several aspects described below.

DETAILED DESCRIPTION

Figure 1:
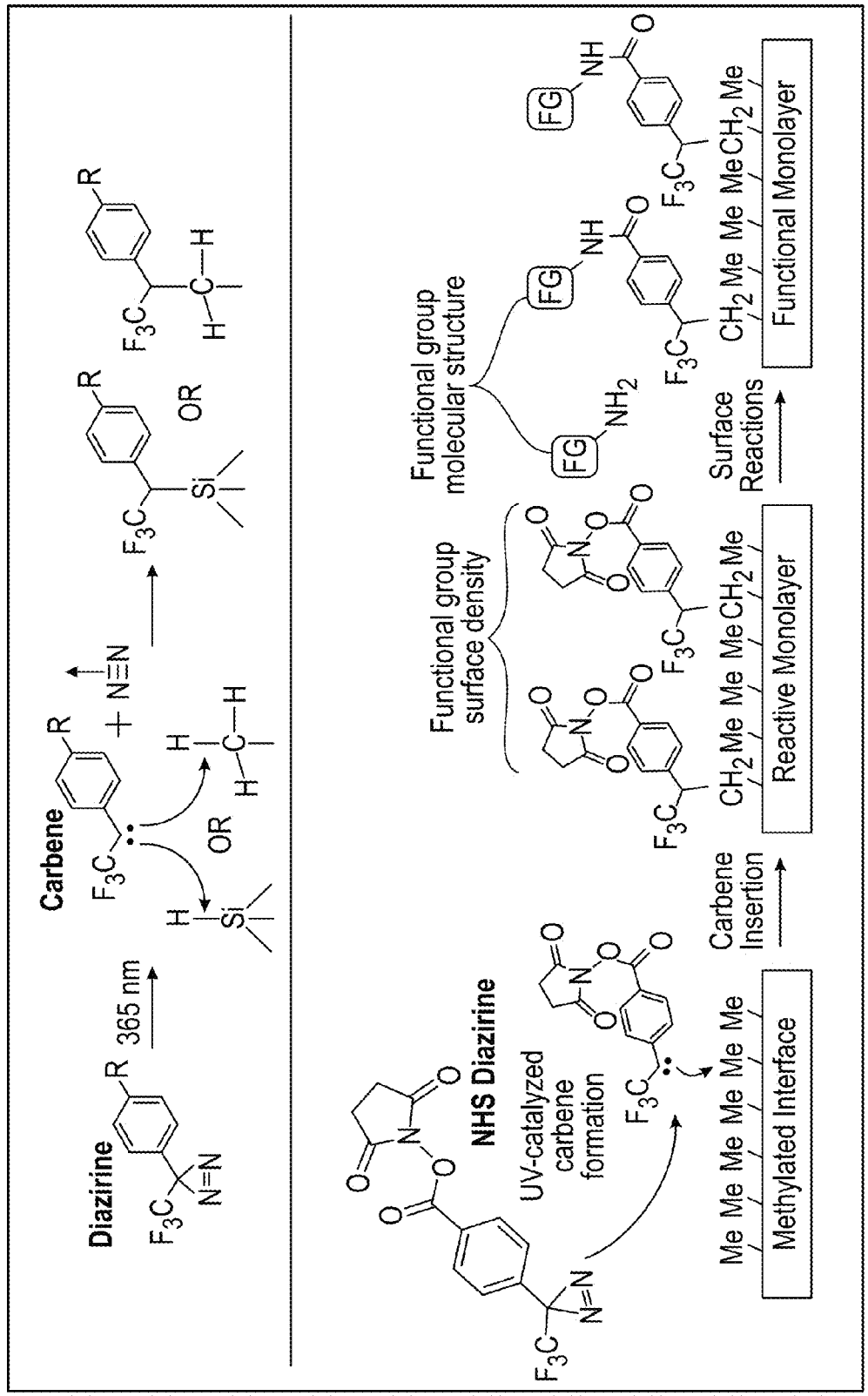
FIG. 1 is a schematic diagram showing carbene generation from diazirines and carbene insertion into Si—H and —$CH_3$ bonds (top) and functionalization of methylated surfaces with heterobifunctional diazirines.

Compositions and methods for depositing a monolayer onto the surface of a substrate are described herein. In some aspects, the method can include contacting the surface with a vapor phase comprising a carbene source, and reacting a carbene group from the carbene source with a functional group on the surface, to obtain a covalently bound monolayer on the surface of the substrate. In some aspects, the method can be free or substantially free of a solvent. Substantially free, as used herein, refers to a reaction composition, for example, with trace amounts or less of a solvent such as less than 0.5 wt %, less than 0.3 wt %, less than 0.1 wt %, less than 0.05 wt %, less than 0.01 wt %, less than 0.001 wt %, or 0 wt %, based on the total weight of the reactants. The resulting monolayer is covalently bonded to the surface, thus providing stability and enhanced functionality of the monolayer. The characteristics and properties of the monolayer can be varied and altered by changing the carbene species or by incorporating functional groups into the covalently bound monolayer.

Compositions and methods for depositing a mixed-monolayer onto a surface of a substrate are also described herein.

Before the present compositions and methods are described, it is to be understood that this disclosure is not limited to specific surfaces, such as a soft, rough, and/or porous surface, as such may, of course, vary. It is also to be understood that the terminology used herein is for the purpose of describing particular embodiments only and is not intended to be limiting.

Throughout the description and claims of this specification the word "comprise" and other forms of the word, such as "comprising" and "comprises," means including but not limited to, and is not intended to exclude, for example, other additives, components, integers, or steps.

As used in the specification and the appended claims, the singular forms "a," "an" and "the" include plural referents unless the context clearly dictates otherwise. Thus, for example, reference to "a diazirine" includes mixtures of various diazirine compounds, reference to "the carbene precursor" includes mixtures of carbene precursors, and the like.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed.

"Carbene precursor" as used herein refers to a compound, complex, and/or molecule capable of forming a carbene group.

As used herein, the term "substituted" is contemplated to include all permissible substituents of organic compounds. In a broad aspect, the permissible substituents include acyclic and cyclic, branched and unbranched, carbocyclic and heterocyclic, and aromatic and nonaromatic substituents of organic compounds. Illustrative substituents include, for example, those described below. The permissible substituents can be one or more and the same or different for appropriate organic compounds. For purposes of this disclosure, the heteroatoms, such as nitrogen, can have hydrogen substituents and/or any permissible substituents of organic compounds described herein which satisfy the valencies of the heteroatoms. This disclosure is not intended to be limited in any manner by the permissible substituents of organic compounds. Also, the terms "substitution" or "substituted with" include the implicit proviso that such substitution is in accordance with permitted valence of the substituted atom and the substituent, and that the substitution results in a stable compound, e.g., a compound that does not spontaneously undergo transformation such as by rearrangement, cyclization, elimination, etc. In specific examples herein, where a substituted is said to be substituted it can be substituted with sulfonic acid, sulfonate, amino, amido, alkyl, alkenyl, alkynyl, alkoxyl, aryl, carbonyl, carboxylate, carbamyl, cyano, ester, halogen, heteroaryl, hydroxyl, nitrile, nitro, sulfinyl, sulfanyl, or thiol.

"$Z^1$," "$Z^2$," "$Z^3$," and "$Z^4$" are used herein as generic symbols to represent various specific substituents. These symbols can be any substituent, not limited to those disclosed herein, and when they are defined to be certain substituents in one instance, they can, in another instance, be defined as some other substituents.

The term "alkyl" as used herein is a branched or unbranched saturated hydrocarbon group of 1 to 24 carbon atoms, such as methyl, ethyl, n-propyl, isopropyl, n-butyl, isobutyl, t-butyl, pentyl, hexyl, heptyl, octyl, nonyl, decyl, dodecyl, tetradecyl, hexadecyl, eicosyl, tetracosyl, and the like. The alkyl group can also be substituted or unsubstituted. The alkyl group can be substituted with one or more groups including, but not limited to, alkyl, halogenated alkyl, alkoxy, alkenyl, alkynyl, aryl, heteroaryl, aldehyde, amino, carboxylic acid, ester, ether, halide, hydroxy, ketone, nitro, silyl, sulfo-oxo, sulfonyl, sulfone, sulfoxide, or thiol, as described below.

Throughout the specification "alkyl" is generally used to refer to both unsubstituted alkyl groups and substituted alkyl groups; however, substituted alkyl groups are also specifically referred to herein by identifying the specific substituent(s) on the alkyl group. For example, the term "alkylhalide" specifically refers to an alkyl group that is substituted with one or more halide, e.g., fluorine, chlorine, bromine, or iodine. The term "alkoxyalkyl" specifically refers to an alkyl group that is substituted with one or more alkoxy groups, as described below. The term "alkylamino" specifically refers to an alkyl group that is substituted with one or more amino groups, as described below, and the like. When "alkyl" is used in one instance and a specific term such as "alkylalcohol" is used in another, it is not meant to imply that the term "alkyl" does not also refer to specific terms such as "alkylalcohol" and the like.

The term "alkoxyl" as used herein is an alkyl group bound through a single, terminal ether linkage; that is, an "alkoxyl" group can be defined as —$OZ^1$ where $Z^1$ is alkyl as defined above.

The term "alkenyl" as used herein is a hydrocarbon group of from 2 to 24 carbon atoms with a structural formula containing at least one carbon-carbon double bond. Asymmetric structures such as $(Z^1Z^2)C=C(Z^3Z^4)$ are intended to include both the E and Z isomers. This can be presumed in structural formulae herein wherein an asymmetric alkene is present, or it can be explicitly indicated by the bond symbol C=C. The alkenyl group can be substituted with one or more groups including, but not limited to, alkyl, halogenated alkyl, alkoxy, alkenyl, alkynyl, aryl, heteroaryl, aldehyde, amino, carboxylic acid, ester, ether, halide, hydroxy, ketone, nitro, silyl, sulfo-oxo, sulfonyl, sulfone, sulfoxide, or thiol, as described below.

The term "alkynyl" as used herein is a hydrocarbon group of 2 to 24 carbon atoms with a structural formula containing at least one carbon-carbon triple bond. The alkynyl group can be substituted with one or more groups including, but not limited to, alkyl, halogenated alkyl, alkoxy, alkenyl, alkynyl, aryl, heteroaryl, aldehyde, amino, carboxylic acid, ester, ether, halide, hydroxy, ketone, nitro, silyl, sulfo-oxo, sulfonyl, sulfone, sulfoxide, or thiol, as described below.

The term "aryl" as used herein is a group that contains any carbon-based aromatic group including, but not limited to, benzene, naphthalene, phenyl, biphenyl, phenoxybenzene, and the like. The term "heteroaryl" is defined as a group that contains an aromatic group that has at least one heteroatom incorporated within the ring of the aromatic group. Examples of heteroatoms include, but are not limited to, nitrogen, oxygen, sulfur, and phosphorus. The term "nonheteroaryl," which is included in the term "aryl," defines a group that contains an aromatic group that does not contain a heteroatom. The aryl or heteroaryl group can be substituted or unsubstituted. The aryl or heteroaryl group can be substituted with one or more groups including, but not limited to, alkyl, halogenated alkyl, alkoxy, alkenyl, alkynyl, aryl, heteroaryl, aldehyde, amino, carboxylic acid, ester, ether, halide, hydroxy, ketone, nitro, silyl, sulfo-oxo, sulfonyl, sulfone, sulfoxide, or thiol as described herein. The term "biaryl" is a specific type of aryl group and is included in the definition of aryl. Biaryl refers to two aryl groups that are bound together via a fused ring structure, as in naphthalene, or are attached via one or more carbon-carbon bonds, as in biphenyl.

The term "aryloxyl" is an aryl group bonded through a single, terminal ether linkage, i.e., —$OZ^1$ where $Z^1$ is aryl as defined above.

The term "cycloalkyl" as used herein is a non-aromatic carbon-based ring composed of at least three carbon atoms. Examples of cycloalkyl groups include, but are not limited to, cyclopropyl, cyclobutyl, cyclopentyl, cyclohexyl, etc. The term "heterocycloalkyl" is a cycloalkyl group as defined above where at least one of the carbon atoms of the ring is substituted with a heteroatom such as, but not limited to, nitrogen, oxygen, sulfur, or phosphorus. The cycloalkyl group and heterocycloalkyl group can be substituted or unsubstituted. The cycloalkyl group and heterocycloalkyl group can be substituted with one or more groups including, but not limited to, alkyl, alkoxy, alkenyl, alkynyl, aryl, heteroaryl, aldehyde, amino, carboxylic acid, ester, ether, halide, hydroxy, ketone, nitro, silyl, sulfo-oxo, sulfonyl, sulfone, sulfoxide, or thiol as described herein.

The term "cycloalkenyl" as used herein is a non-aromatic carbon-based ring composed of at least three carbon atoms and containing at least one double bound, i.e., C=C. Examples of cycloalkenyl groups include, but are not limited to, cyclopropenyl, cyclobutenyl, cyclopentenyl, cyclopentadienyl, cyclohexenyl, cyclohexadienyl, and the like. The term "heterocycloalkenyl" is a type of cycloalkenyl group as defined above, and is included within the meaning of the term "cycloalkenyl," where at least one of the carbon atoms of the ring is substituted with a heteroatom such as, but not limited to, nitrogen, oxygen, sulfur, or phosphorus. The cycloalkenyl group and heterocycloalkenyl group can be substituted or unsubstituted. The cycloalkenyl group and heterocycloalkenyl group can be substituted with one or more groups including, but not limited to, alkyl, alkoxy, alkenyl, alkynyl, aryl, heteroaryl, aldehyde, amino, carboxylic acid, ester, ether, halide, hydroxy, ketone, nitro, silyl, sulfo-oxo, sulfonyl, sulfone, sulfoxide, or thiol as described herein. The term "cyclic group" is used herein to refer to either aryl groups, non-aryl groups (i.e., cycloalkyl, heterocycloalkyl, cycloalkenyl, and heterocycloalkenyl groups), or both. Cyclic groups have one or more ring systems that can be substituted or unsubstituted. A cyclic group can contain one or more aryl groups, one or more non-aryl groups, or one or more aryl groups and one or more non-aryl groups.

The term "aldehyde" as used herein is represented by the formula —C(O)H. Throughout this specification "C(O)" or "CO" is a short hand notation for C=O.

The terms "amine" or "amino" as used herein are represented by the formula —$NZ^1Z^2$, where $Z^1$ and $Z^2$ can each be substitution group as described herein, such as hydrogen, an alkyl, halogenated alkyl, alkenyl, alkynyl, aryl, heteroaryl, cycloalkyl, cycloalkenyl, heterocycloalkyl, or heterocycloalkenyl group described above.

The term "amido" or "amide" is represented by the formula —$N(Z^1)C(O)Z^2$, where $Z^1$ and $Z^2$ can each be substitution group as described herein, such as hydrogen, an alkyl, halogenated alkyl, alkenyl, alkynyl, aryl, heteroaryl, cycloalkyl, cycloalkenyl, heterocycloalkyl, or heterocycloalkenyl group described above.

The term "carboxylic acid" as used herein is represented by the formula —C(O)OH. A "carboxylate" or "carboxyl" group as used herein is represented by the formula —C(O)O.

The term "cyano" is represented by the formula —CN.

The term "cyanato" is represented by the formula —CNO.

The term "ester" as used herein is represented by the formula —$OC(O)Z^1$ or —$C(O)OZ^1$, where $Z^1$ can be an alkyl, halogenated alkyl, alkenyl, alkynyl, aryl, heteroaryl, cycloalkyl, cycloalkenyl, heterocycloalkyl, or heterocycloalkenyl group described above. The term "ether" as used herein is represented by the formula $Z^1OZ^2$, where $Z^1$ and $Z^2$ can be, independently, an alkyl, halogenated alkyl, alkenyl, alkynyl, aryl, heteroaryl, cycloalkyl, cycloalkenyl, heterocycloalkyl, or heterocycloalkenyl group described above.

The term "ketone" as used herein is represented by the formula $Z^1C(O)Z^2$, where $Z^1$ and $Z^2$ can be, independently, an alkyl, halogenated alkyl, alkenyl, alkynyl, aryl, heteroaryl, cycloalkyl, cycloalkenyl, heterocycloalkyl, or heterocycloalkenyl group described above.

The term "halide" or "halogen" as used herein refers to the fluorine, chlorine, bromine, and iodine.

The term "hydroxyl" as used herein is represented by the formula —OH.

The term "nitro" as used herein is represented by the formula —$NO_2$.

The term "nitroso" as used herein is represented by the formula —NO.

The term "silyl" as used herein is represented by the formula —$SiZ^1Z^2Z^3$, where $Z^1$, $Z^2$, and $Z^3$ can be, independently, hydrogen, alkyl, halogenated alkyl, alkoxy, alkenyl, alkynyl, aryl, heteroaryl, cycloalkyl, cycloalkenyl, heterocycloalkyl, or heterocycloalkenyl group described above.

The term "sulfonyl" is used herein to refer to the sulfo-oxo group represented by the formula —$S(O)_2Z^1$, where $Z^1$ can be hydrogen, an alkyl, halogenated alkyl, alkenyl, alkynyl, aryl, heteroaryl, cycloalkyl, cycloalkenyl, heterocycloalkyl, or heterocycloalkenyl group described above.

The term "sulfonate" or "sulfanato" refers to the sulfo-oxo group represented by the formula —$SO_3$.

The term "sulfonylamino" or "sulfonamide" as used herein is represented by the formula —$S(O)_2NH$—.

The term "phosphonyl" is used herein to refer to the phospho-oxo group represented by the formula —$P(O)(OZ^1)_2$, where $Z^1$ can be hydrogen, an alkyl, halogenated alkyl, alkenyl, alkynyl, aryl, heteroaryl, cycloalkyl, cycloalkenyl, heterocycloalkyl, or heterocycloalkenyl group described above.

The term "thio" as used herein is represented by the formula —S—.

The term "thiocyanato" is represented by the formula —CNS.

The term "thiol" as used herein is represented by the formula —SH.

"$R^1$," "$R^2$," "$R^3$," "$R^n$," etc., where n is some integer, as used herein can, independently, possess one or more of the groups listed above. For example, if $R^1$ is a straight chain alkyl group, one of the hydrogen atoms of the alkyl group can optionally be substituted with a hydroxyl group, an alkoxy group, an amine group, an alkyl group, a halide, and the like. Depending upon the groups that are selected, a first group can be incorporated within second group or, alternatively, the first group can be pendant (i.e., attached) to the second group. For example, with the phrase "an alkyl group comprising an amino group," the amino group can be incorporated within the backbone of the alkyl group. Alternatively, the amino group can be attached to the backbone of the alkyl group. The nature of the group(s) that is (are) selected will determine if the first group is embedded or attached to the second group.

Unless stated to the contrary, a formula with chemical bonds shown only as solid lines and not as wedges or dashed lines contemplates each possible isomer, e.g., each enantiomer, diastereomer, and meso compound, and a mixture of isomers, such as a racemic or scalemic mixture.

"Monolayer" as used herein refers to a single layer of molecules on the surface of a substrate, wherein the molecules are covalently bonded to the surface.

"Optional" or "optionally" means that the subsequently described event or circumstance can or cannot occur, and that the description includes instances where the event or circumstance occurs and instances where it does not.

Reference will now be made in detail to specific aspects of the disclosed materials, compounds, compositions, articles, and methods, examples of which are illustrated in the accompanying Examples and Figures.

Compositions

Any suitable carbene source can be used in the methods described herein. In some aspects, the carbene source can be selected from a carbene-containing compound, a carbene precursor, or combinations thereof. In some examples, the carbene source can be a carbene precursor. The carbene precursor can be any suitable compound, complex, and/or molecule that can form a carbene group. In some examples, suitable conditions for forming a carbene group from the carbene precursor can include changes in conditions of temperature, pressure, humidity, light exposure, and/or chemical environment. In specific examples, the carbene source contains another functional group that can be used to later functionalize the surface of the substrate. For example, the carbene source can comprise a hydroxyl, thiol, ester, ether, amide, succinimide, or a carbamate functional group. In a specific example, the carbene source can comprise a N-hydroxysuccinimide functional group.

The carbene precursor can be a diazirine compound. Diazirines can form carbenes when irradiated by ultraviolet (UV) light. In some aspects, the carbene precursor can be a diazirine, represented by the formula:

where R and $R^1$ can be independently include a group selected from hydrogen, halogen, hydroxyl an alkylhalide, substituted or unsubstituted $C_1$ to $C_{30}$ alkyl, substituted or unsubstituted aryl (for e.g., phenyl, naphthyl, or anthracenyl), an amide, an ester, an ether, a succinimide, a carbamate, substituted or unsubstituted alkylaryl, substituted or unsubstituted heteroaryl (for e.g., pyridine, pyrimidine), alkoxyl, aryloxyl, sulfhydryl, cyano, cyanato, thiocyanato, amino, nitro, nitroso, sulfo, sulfonato, boryl, borono, phosphono, phosphonato, phosphinato, phospho, phosphino, siloxy, or combinations thereof. In some aspects, R can be hydrogen, halogen, methyl, alkylhalide, a $C_1$ to $C_5$ alkyl, a substituted or unsubstituted aryl, a substituted or unsubstituted heteroaryl, an alkoxyl, an aryloxyl, an amide, an ester, sulfhydryl, cyano, cyanato, thiocyanato, amino, nitro, nitroso, sulfo, sulfonato, succinimide, carbamate, boryl, borono, phosphono, phosphonato, phosphinato, phospho, phosphino, or siloxy, and $R^1$ can be hydrogen, halogen, alkylhalide, a substituted or unsubstituted aryl, a substituted or unsubstituted heteroaryl, an alkoxyl, an aryloxyl, an amide, an ester, succinimide, carbamate, sulfhydryl, cyano, cyanato, thiocyanato, amino, nitro, nitroso, sulfo, sulfonato, boryl, borono, phosphono, phosphonato, phosphinato, phospho, phosphino, or siloxy. In some aspects, the R and $R^1$ are independently substituted with N-hydroxysuccinimide (NHS), halogen, alkylhalide, $C_1$ to $C_{30}$ alkyl, aryl (for e.g., phenyl, naphthyl, or anthracenyl), an amide, an ester, alkylaryl, heteroaryl (for e.g., pyridine, pyrimidine), alkoxyl, aryloxyl, sulfhydryl, cyano, cyanato, thiocyanato, amino, nitro, nitroso, sulfo, sulfonato, boryl, borono, phosphono, phosphonato, phosphinato, phospho, phosphino, siloxy, diazene, or combinations thereof. Thiazolylidenes, P-heterocyclic carbenes (PHCs), cyclic(alkyl)(amino)carbenes (CAACs), and cyclopropenylidenes can also be used as carbene precursors.

In some aspects, R can be an electronegative group including a halogen and trihalomethyl (for example, trifluoromethyl or trichloromethyl). In some aspects, $R^1$ can be selected from methyl, a substituted aryl, a substituted heteroaryl or a substituted heteroaryl. $R^1$ can be substituted with a group selected from N-hydroxysuccinimide (NHS), an amide, an ester, halogen, alkylhalide, or combinations thereof. Specific examples of the carbene precursor can include 3-trifluoromethyl-3-phenyldiazirine, 3-(trifluoromethyldiazirinyl)phenyl, 4-(trifluoromethyldiazirinyl)phenyl, or combinations thereof.

In some aspects, the carbene precursor can be a diazo compound. Diazo compounds are thermally unstable and generate free carbenes upon heating or photochemical activation. In some examples, the carbene precursor can be a diazo compound, represented by the formula:

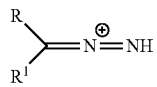

where R and $R^1$ are as described herein. In some examples, the carbene precursor can be a diazo ester.

In some aspects, the carbene precursor can be a ketene containing compound, for example a diphenylketene.

The carbene group of the carbene source can react with any suitable functional group on the surface of the substrate to form a covalent bond. For example, the carbene group can react with a functional group selected from —OH, SH, —NH$_2$, —CH, or —SiH to form an O—C, S—C, HN—C, C—C, or Si—C bond, respectively (FIG. 1). Preferably, the functional group on the surface comprises a —CH group, a —SiH group, or combinations thereof. In some examples, the —CH group can be from an alkyl group (for example, a methyl, ethyl, propyl, etc.), an alkenyl group (for example, —C=CH$_2$), an alkynyl group, an allyl group, or combinations thereof.

In some aspects, the surface of the substrate can include a bulk material, a thin film, a surface of a particle, a nanostructured surface, a porous material or a membrane. In some examples, the surface can comprise an organic material, an inorganic material, or combinations thereof, wherein the organic material and the inorganic material comprises a functional group reactive with the carbene group. In some examples, the surface comprises an organic material. The organic material can be a thin film including, for example an organic monolayer or an organic multilayer. In some cases, the organic material can include a polymeric material. Such organic polymeric materials can comprise a polymer selected from polyolefins, polyesters, polyamides, polystyrenics, polytetrafluoroethylene, polyglycosides, polypeptides, polyacrylates, polyacrylics, polycarbonates, polyethers, polyketones, rubbers, polysulfones, polyurethanes, polyvinyls, polysaccharides, polysilanes, polysiloxanes, polydimethyl silanes, or combinations thereof. In some examples, the organic polymeric material is a semiconducting organic polymer. In still further examples, the surface can comprise a thin film of small organic molecules. Such small organic molecules can include a $C_1$-$C_x$ alkyl group, a $C_2$-$C_x$ alkenyl group, a $C_2$-$C_x$ alkynyl group, or a combination thereof, where x is an integer from 2 to 20. For example, x can be 2, 3, 4, 5, 6, 7, 8, 9, 10, 11, 12, 13, 14, 15, 16, 17, 18, 19, or 20.

In some examples, the surface comprises an inorganic material. The inorganic material can be in the form of an inorganic thin film including an inorganic monolayer or an inorganic multilayer. In some examples, the inorganic material can comprise group II, III, IV, V semiconductors (e.g., Si, C, SiC, Ge, GaAs, GaN, CdTe, CdS, CdSe, and the like). In other examples, the inorganic material can comprise conductive oxides (e.g., molybdenum oxide, tungsten oxide, ruthenium oxide, iron oxide, iridium oxide, chromium oxide, manganese oxide, tin oxide, cobalt oxide, nickel oxide, indium tin oxide (ITO), aluminum zinc oxide (AZO), indium zinc oxide (IZO), and cadmium stannic oxide (CdSnO)). In still other examples, the inorganic material can comprise silicon, silicon nitride, silicon oxinitride, alumina, titania, glass, an allotrope of carbon, or combinations thereof. Allotropes of carbon can include graphene, graphite, carbon nanotubes, and diamonds.

In some cases, the film on the substrate can be annealed to improve the properties of the film. Annealing may include either a thermal anneal or a plasma anneal and may be used periodically to reduce film stress of the resulting film layer(s).

Methods

Methods for depositing a monolayer onto the surface of a substrate are described herein. In some aspects, the method can include contacting the surface with a vapor phase comprising a carbene source, and reacting a carbene group from the carbene source with a functional group on the surface to obtain a covalently bound monolayer on the surface of the substrate. The methods described herein uses vapor-based deposition of the monolayer onto the surface thus, in some examples, the method can be free or substantially free of a solvent. Vapor-based deposition can avoid undesirable effects such as capillary effects, changes in material concentration, and crystallization during drying.

Figure 2:
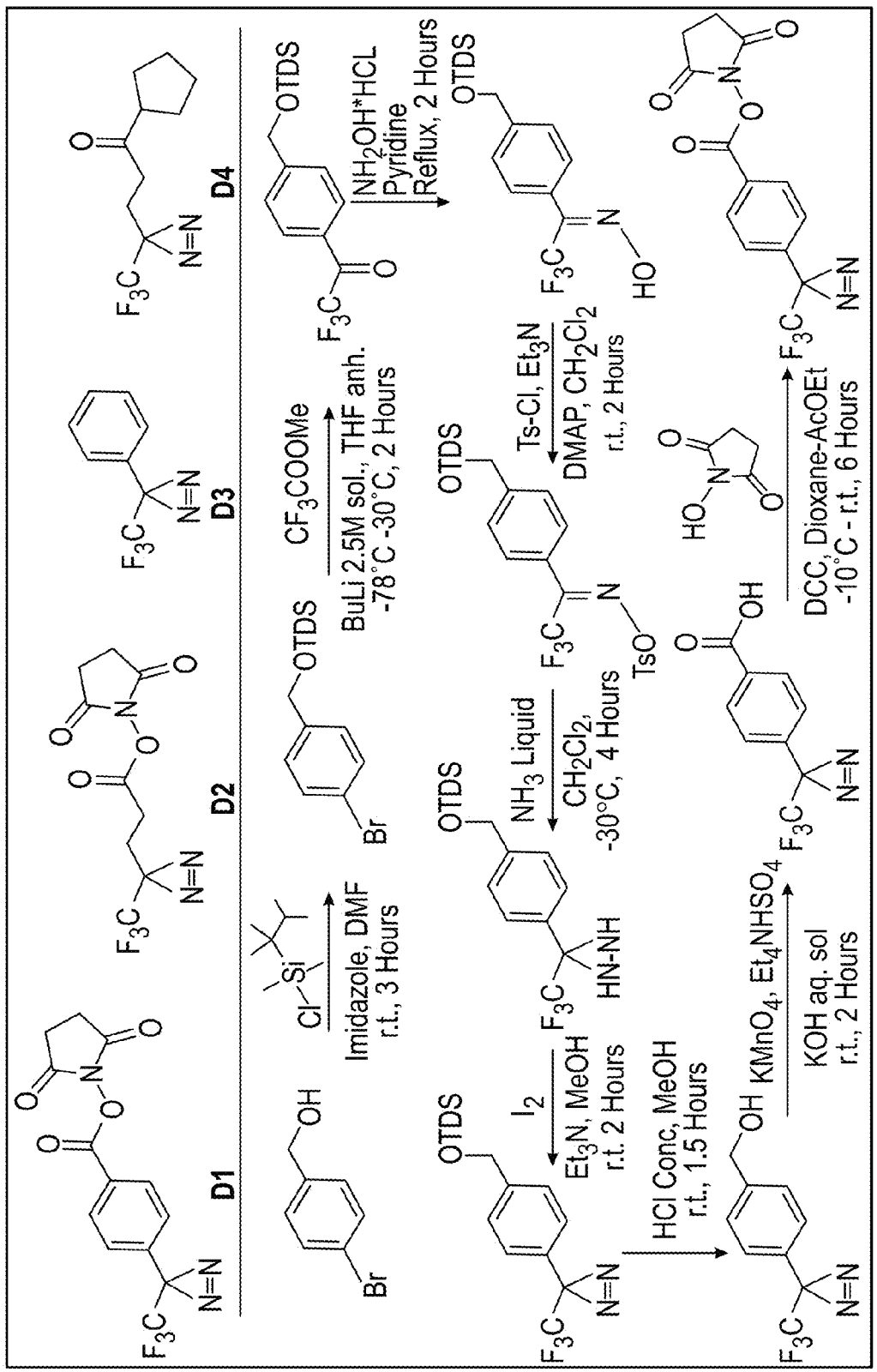
FIG. 2 is a schematic diagram showing selected diazirines (D1-D4) with inert and functional (NHS-esters) moieties (top) and an exemplary synthetic scheme of the NHS-diazirines (bottom).

Carbene sources are known to those of ordinary skill in the art. Exemplary carbene sources and methods of making are shown in FIG. 2. The method of making the carbene source may change based on the particular carbene source.

The disclosed methods can include heating the carbene source to generate a vapor. In some examples, the carbene source can be heated up to a temperature of about 0° C. or greater, for example, from about 0° C. to about 500° C., from about 20° C. to about 300° C., from about 100° C. to about 200° C., or from about 100° C. to about 150° C. In some examples, the carbene source can be heated to establish a suitable vapor pressure. In some examples, the vapor can be from about $10^{-2}$ Torr to about $10^{-9}$ Torr, for example, about $10^{-2}$, $10^{-3}$, $10^{-4}$, $10^{-5}$, $10^{-6}$, $10^{-7}$, $10^{-8}$, or $10^{-9}$ Torr, where any of the stated values can form an upper or lower endpoint of a range. The temperature may change based on the particular carbene source and/or the vapor pressure desired. In some cases, a carrier gas can be used to contact the surface with the vapor phase.

The disclosed methods can include contacting a surface of the substrate with the vapor comprising the carbene source. In some examples, the substrate can be positioned in the path of the vapor. The vapor-based deposition of the monolayer can be vacuum assisted, for example vacuum assisted physical vapor deposition or a vacuum assisted chemical vapor deposition. In some aspects, contacting the surface with the vapor can be vacuum-assisted. For example, the substrate and the carbene source can be contained within a chamber. In some examples, the pressure within the chamber can be about 150 mTorr or greater, for example, about 175 mTorr or greater, about 200 mTorr or greater, or from about 150 to about 250 mTorr, about 150 to about 200 mTorr. Vacuum-assisted physical vapor deposition can permit multistep monolayer deposition in a single apparatus, without the intermediate rinsing or drying steps.

Optionally, the disclosed methods can include generating the carbene group from the carbene source. For example, when the carbene source is a carbene precursor, the method can include generating the carbene group from the carbene precursor. In some aspects, the method can include irradiating the carbene precursor, for example using an ultraviolet (UV) light source, to generate the carbene group. In some examples, the carbene precursor can be irradiated at a wavelength of from 200 nm to 400 nm, e.g., 200 nm, 220 nm, 240 nm, 260 nm, 280 nm, 300 nm, 320 nm, 340 nm, 360 nm, 380 nm, or 400 nm, where any of the stated values can form an upper or lower endpoint of a range. The wavelength may change based on the particular carbene source. The carbene precursor can be irradiated before it is contacted with the surface or after it is contacted with the surface.

The disclosed methods can include reacting a carbene group of the carbene precursor with a functional group on the surface of the substrate. In some examples, where the substrate does not comprise a functional group reactive with the carbene or a more desirable functional group is required, the disclosed methods can include providing a functional group on the surface of the substrate. Any suitable method for providing a functional group on the surface of a substrate can be used. For example, the method can include coating the substrate with a film, the film comprising a functional group reactive with the carbene group. The method for depositing the film can include conventional methods for depositing a self-assembly monolayer, or any other means for depositing a film on a substrate. In some examples, the disclosed methods can include generating a functional group reactive with the carbene group, on the surface of the substrate. For example, generating the functional group can include reduction and/or substitution of a functional group present on the surface of the substrate. In some examples, the disclosed methods can include covalent addition of a functional group reactive with the carbene group to the surface of the substrate. For example, covalent addition of a functional group can include nucleophilic or electrophilic addition of a compound to the surface of the substrate.

Figure 4:
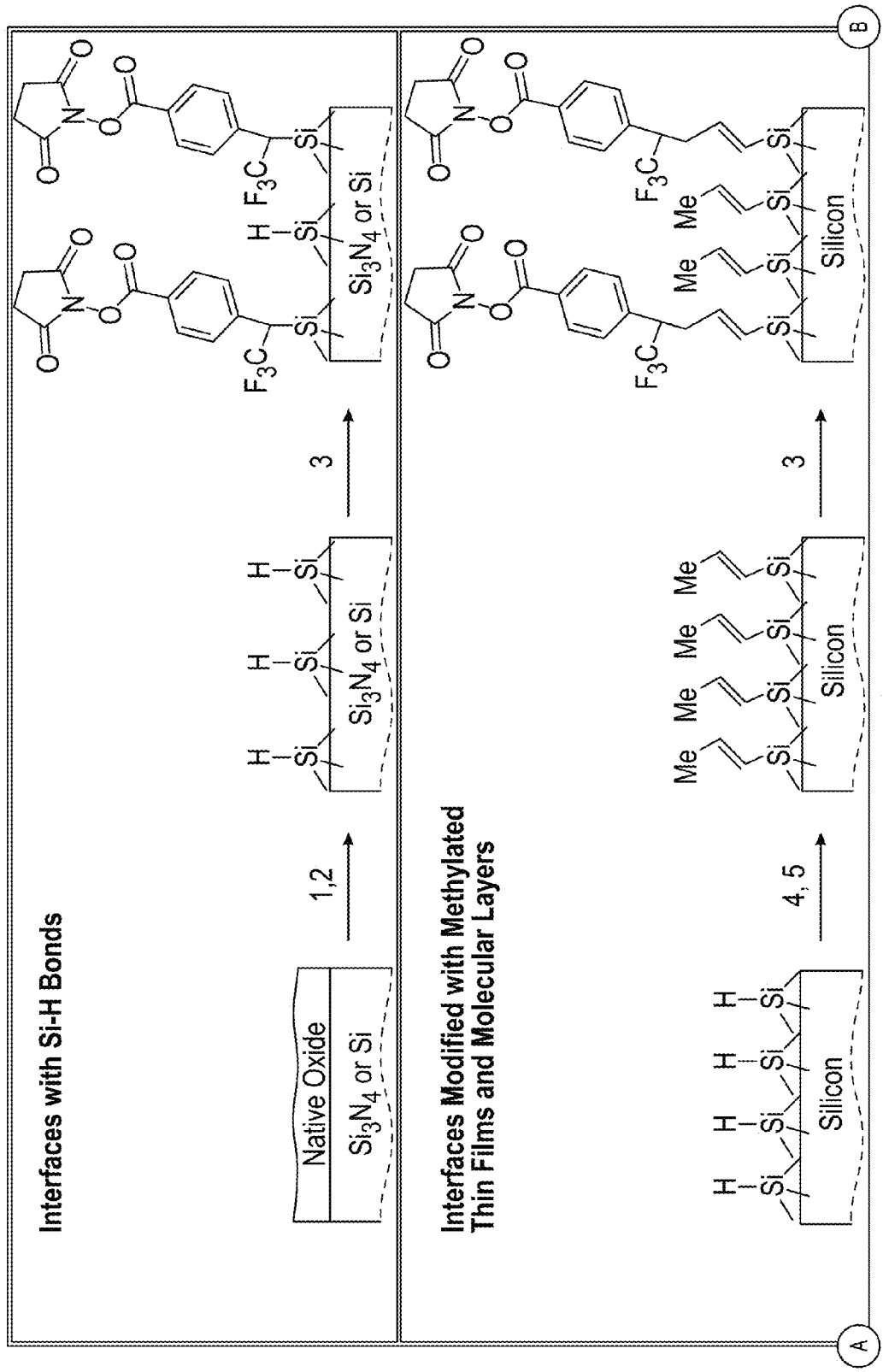
FIG. 4 is a schematic diagram showing carbenylation of silicon, silicon nitride, indium tin oxide, and polyurethane-acrylate polymer.
Figure 4:
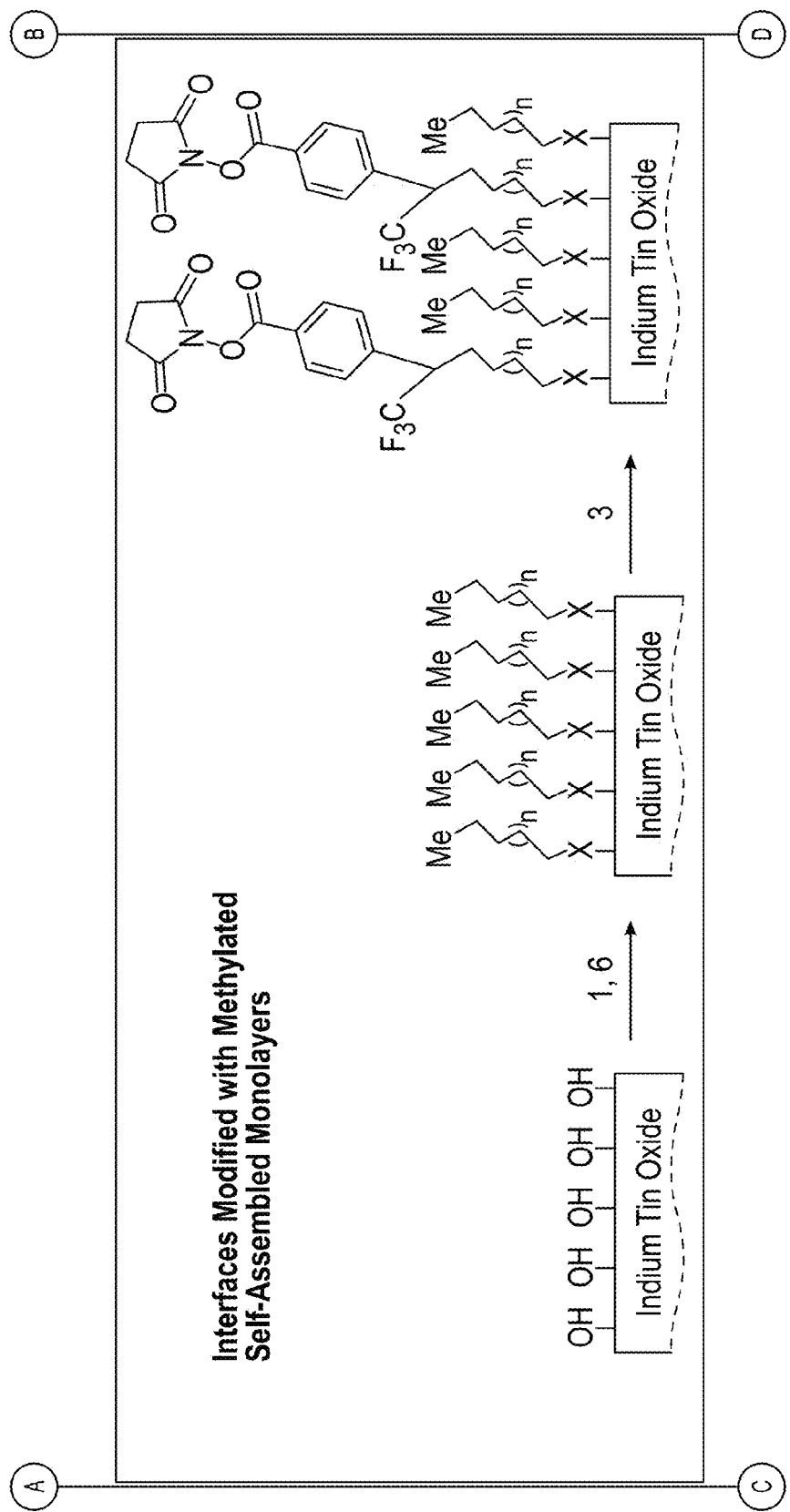
Figure 4:
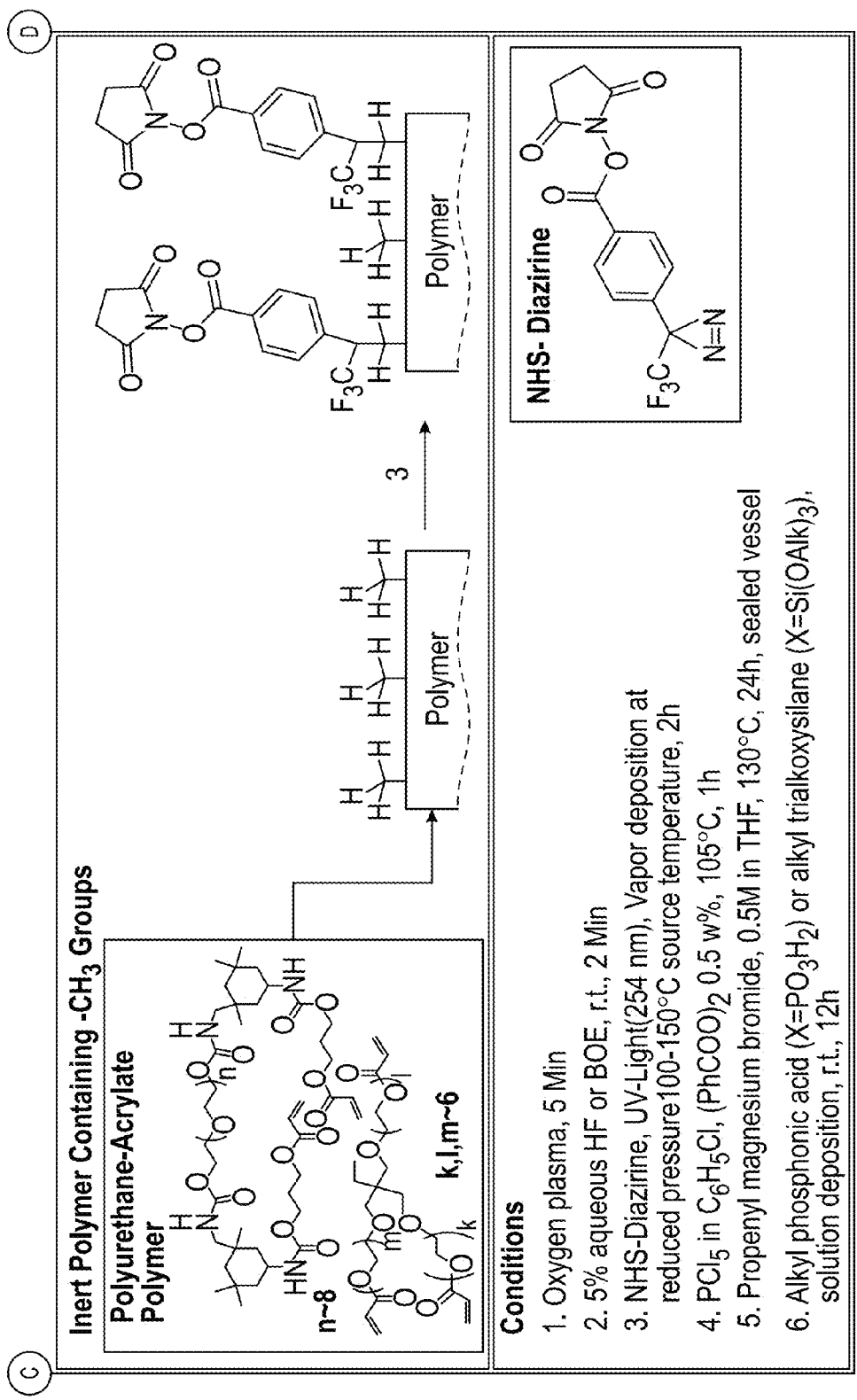

In particular, in some examples, the substrate can be derived from silicon or silicon nitride. The disclosed methods can include generating a Si—H terminated surface on the silicon or silicon nitride substrate (FIG. 4). For example, the disclosed methods can initially include stripping any native oxide from the surface. In some examples, the native oxide layer can be stripped using for example, a nanostrip solution or by exposing the substrate to oxygen plasma. The surface can then be rinsed and reacted with a suitable compound to generate a Si—H terminated surface. In some examples, the disclosed methods can include reacting the substrate with hydrofluoric acid (HF) solution or buffered oxide etch (BOE) to create the Si—H terminated surface. Si—H can react with the carbene group to form a Si—C covalent bond.

In some examples, the surface can be coated with a self-assembly monolayer. The monolayer can comprise a functional group reactive with the carbene, for example an alkyl-, alkenyl-, allyl-, or an alkynyl-terminate monolayer (FIG. 4). Specifically, the method can include halogenating a Si—H terminated surface using for example phosphorus pentachloride $PCl_5$ followed by nucleophilic substitution. In some examples, the reagent for nucleophilic substitution can include a Grignard reagent, such as an allyl-Grignard. The allyl groups can form a stable, closely packed C—H terminated self-assembled monolayer. The C—H terminated self-assembled monolayer can react with the carbene group to form a C—C covalent bond.

In some examples, the substrate can comprise a hydroxyl or an amine group. Hydroxyl and amine groups can react with the carbene group, however, the resulting bonds may be susceptible to hydrolysis. It can be desirable to generate a C—H terminated surface on the substrate. Specifically, the substrate can be derived from indium tin oxide comprising hydroxyl groups on the surface. In some examples, the disclosed methods can initially include stripping away impurities from the surface, for example by exposing the surface to oxygen plasma. The surface can then be rinsed and reacted with a suitable compound to generate a C—H terminated surface. In some examples, the disclosed methods can include reacting the substrate with alkyl phosphonic acid or alkyl trialkyloxysilane to generate a C—H terminated surface. C—H can react with the carbene group to form a C—C covalent bond.

In some examples, the surface can be coated with a C—H terminated thin film, for example, using physical vapor deposition, chemical vapor deposition, or plasma-enhanced chemical vapor deposition.

In some examples, the reaction between the carbene group and the functional group can be carried out at a temperature of from about 0° C. to about 500° C., more particularly from about 25° C. to about 200° C., from about 50° C. to about 150° C., from about 70° C. to about 150° C., or from about 100° C. to about 150° C. The disclosed methods can include heating the vapor phase and the substrate to the reaction temperature, for example, up to a temperature of about 50° C. or greater. In some examples, the reaction time can be about 3 hours or less, for example from about 1 hour to about 3 hours.

Methods for depositing stable and uniform mixed-monolayers on the surface of a substrate are also described herein. Mixed-monolayers refers to monolayers comprising two or more dissimilar components in the monolayer. Without wishing to be bound by theory, because the vapor-based deposition methods described herein does not rely on self-assembly and can utilizes non-centrosymmetric molecules with low self-assembly propensity, uniformly mixed monolayers with dissimilar components that do not phase-separated into mono-component surface domains can be formed. In some examples, the composition of the monolayer can be predicted based on the composition of the vapor phase.

The disclosed methods can include contacting the surface with a mixed vapor phase comprising two or more different carbene sources, and reacting the carbene groups of the two or more carbene sources with functional groups on the surface to obtain a covalently bound mixed-monolayer on the surface of the substrate. The mixed-monolayer can comprise two, three, four, or five or more components. In some examples, the ratio of the carbene sources can be from about 1:1 to about 1:1000 such as from about 1:1 to about 1:500 or from about 1:1 to about 1:100. In some examples, the carbene sources can be in a ratio of 1:1. In some examples, the vapor pressure-source temperature dependence for each carbene source, can enable Raoult's law predictions of the vapor phase composition from the melt composition. For example, an inert carrier gas like $N_2$, Ar, or He can be used to control the ratio of molecules in the vapor phase. The carbenes will be evaporated from two different sources that can be set to two different temperatures.

In some examples, the reaction between the two or more carbene groups and the functional group can be carried out at a temperature of from about 0° C. to about 500° C. For example, the temperature for the reaction can be from about 70° C. to about 150° C., from about 20° C. to about 300° C., from about 100° C. to about 200° C., or from about 100° C. to about 150° C. Also, the temperatures of each carbene source can be different. For example, if a carrier gas like $N_2$, Ar, or He is used, having different temperatures can provide control over the carbene ratio in the vapor phase. The disclosed methods can include heating the mixed vapor phase and the substrate to the reaction temperature, for example, up to a temperature of from about 20° C. or greater. In some examples, the reaction time can be about 3 hours or less, for example from about 1 hour to about 3 hours.

The mixed vapor phase can be from a single origin comprising the two or more carbene sources. For example, the two or more carbene sources can be mixed in a single vessel and heated to a common temperature for generating the mixed vapor phase. In some examples, the mixed vapor phase can be from two or more origins, each origin comprising a single carbene source. For example, each of the two or more carbene sources can be mixed in a separate vessel and the temperature of each carbene source can be varied independently prior to forming the mixed vapor phase.

The methods for depositing the monolayers described herein can be carried out in a solvent-free or substantially solvent-free environment. Without wishing to be bound by theory, solution-phase diazirine reactions can impose requirements on the solvent structure used in the carbene attachment, that is, the solvent cannot contain any groups with terminal —$CH_3$, O—H, or N—H bonds. These requirements can limit traditional solvent choices to typically include carbon tetrachloride, benzene, and cyclohexane. Many polymers and thin organic films swell, degrade or simply dissolve in these solvents, making their functionalization with diazirines solutions difficult. UV-catalyzed solution processing of inorganic materials can also be complicated by low solubility of diazirines and fast solvent evaporation rates. The vapor-based deposition methods described herein can mitigate undesirable effects to surfaces obtained with solution-phase reactions.

The methods described herein can include removing physisorbed compounds from the surface of the substrate. Physisorbed compounds can be removed by any suitable method known in the art. For example, physisorbed carbene precursors can be removed by rinsing the surface with a suitable solvent. Suitable solvents for rinsing the surface can include water, carbon tetrachloride, chloroform, dichloromethane, ethanol, isopropanol, acetone, hexane, THF, DMF, DMSO, and combinations thereof. Physisorbed compounds can also be removed by heating the surface in a vacuum. In some examples, the disclosed methods include heating the substrate comprising the covalently bound monolayer in a vacuum having a pressure of about 2 mTorr or greater, for example, about 5 mTorr or greater, about 10 mTorr or greater, or from about 2 to about 20 mTorr, about 2 to about 10 mTorr. The temperature can be about 60° C. or greater, for example, about 80° C. or greater, or about 100° C. or greater. In some examples, the disclosed methods include heating the substrate to a temperature of about 60° C. or greater and at a pressure of about 2 mTorr or greater. Physisorbed compounds can also be removed by evacuating the compounds under pressure. In some examples, physisorbed molecules can be evacuated under a pressure of about $10^{-3}$ mTorr or greater.

The packing and uniformity of the monolayers can be determined by a scanning tunneling microscope (STM), goniometer, measuring the contact angle hysteresis of different solvents on the monolayer, and fluorescent microscopy. Specifically, the monolayers can be modified with a fluorescent compound and the light intensity uniformity monitored using fluorescent microscope images to provide information about the packing and uniformity of the monolayer. For example, in mixed monolayers, the formation of mono-component phase-segregated domains will lead to the microscopic areas of low and high intensity. In some examples, the NHS esters in a monolayer can be modified with a fluorescent organic amine and the light intensity uniformity monitored using fluorescent microscope images. The composition of the monolayer can be determined with X-ray photoelectron spectroscopy (XPS). For example, XPS can monitor N1s peak indigenous to NHS-modified diazirines, and overall F1s peak intensity from both diazirines molecules comprising a trifluoroalkyl group.

The covalently bound monolayer can have a thickness of about 20 nm or less. For example, the monolayer can be about 15 nm or less, about 13 nm or less, about 12 nm or less, about 10 nm or less, about 8 nm or less, about 7 nm or less, about 6 nm or less, about 5 nm or less, about 4 nm or less, or about 3 nm or less. In some examples, the covalently bound monolayer can be about 2 nm to about 20 nm, for example about 5 nm to about 15 nm, or about 2 nm to about 10 nm.

The methods for depositing a monolayer described herein can be carried out on any suitable substrate. In some examples, the substrate can have a surface that is nanostructured, rough, flat, soft, or porous materials (for e.g., nanoporous materials, colloids, membranes, catalyst supports or patterned interfaces).

The reactions between the carbene and functional group reactive with the carbene can create stable non-polar bonds such as C—C and Si—C. The monolayer network is covalently bonded and thus stable under standard atmospheric conditions. In some examples, these bonds can withstand highly hydrolytic environments and harsh conditions. For examples, the covalently bound monolayers can remain in water without hydrolytic cleavage for a period of about 1 day or greater, about 2 days or greater, about 3 days or greater, about 4 days or greater, about 5 days or greater, about 6 days or greater, or about 7 days or greater.

The characteristics and properties of the monolayer can be varied and altered by changing the carbene species or by incorporating functional groups into the covalently bound monolayer. In some embodiments, the method can further comprise reacting the covalently bound monolayer with an organic or inorganic compound. For example, the covalently bound monolayer can be reacted with an organic small molecule, a polymeric group, or an inorganic material. In some aspects, the polymeric group can be a modified polyethylene glycol group.

The monolayers described herein can be used to decrease the level of non-specific binding of biological compounds/fluid to the substrate. For example, the monolayer can be derivatized to include a polymer such as polyethylene glycol. The PEG-derivatized monolayer can be used to decrease the adsorption of biological compounds such as proteins to the substrate.

The substrates comprising the monolayer can be used as membranes where low or high surface density is required. For example, the membranes can be used in biological arrays that support large sensing elements (active proteins or brunched carbohydrates), electronic molecular interfaces that use electron donating moieties to partially block hole injection, or substrates for single molecule AFM studies that require less than 1 molecule/nm² density to accurately measure thermodynamic properties of single species.

In some examples, the mixed monolayer membranes can be used inside organic electronic devices. For example, the surface density of the NHS groups in monolayers immobilized on the indium titanium oxide (ITO) anodes in organic light emitting diodes (OLEDs) can have an effect on the ITO work function and OLED drive voltage. Without wishing to be bound by theory, due to the uniform nature of the mixed monolayers, a liner decrease in the drive voltage and a linear increase in the ITO work function with the increase of NHS surface density can result. In contrast, self-assembled monolayers with phase segregated mono-component domains demonstrate only weak correlations between surface composition and drive voltage due to the ability of current to preferentially flow through micro-domains that have lower electrical resistance and through defect areas that surround phase-separated domains. In some examples, the monolayers disclosed herein can be used in electrical junctions.

EXAMPLES

The following examples are set forth below to illustrate the compositions, methods, and results according to the disclosed subject matter. These examples are not intended to be inclusive of all aspects of the subject matter disclosed herein, but rather to illustrate representative methods, compositions, and results. These examples are not intended to exclude equivalents and variations of the present invention, which are apparent to one skilled in the art.

Efforts have been made to ensure accuracy with respect to numbers (e.g., amounts, temperature, etc.) but some errors and deviations should be accounted for. Unless indicated otherwise, parts are parts by weight. There are numerous variations and combinations of reaction conditions, e.g., component concentrations, temperatures, pressures, and other reaction ranges and conditions that can be used to optimize the product purity and yield obtained from the described process. Only reasonable and routine experimentation will be required to optimize such process conditions.

Example 1

Figure 3:
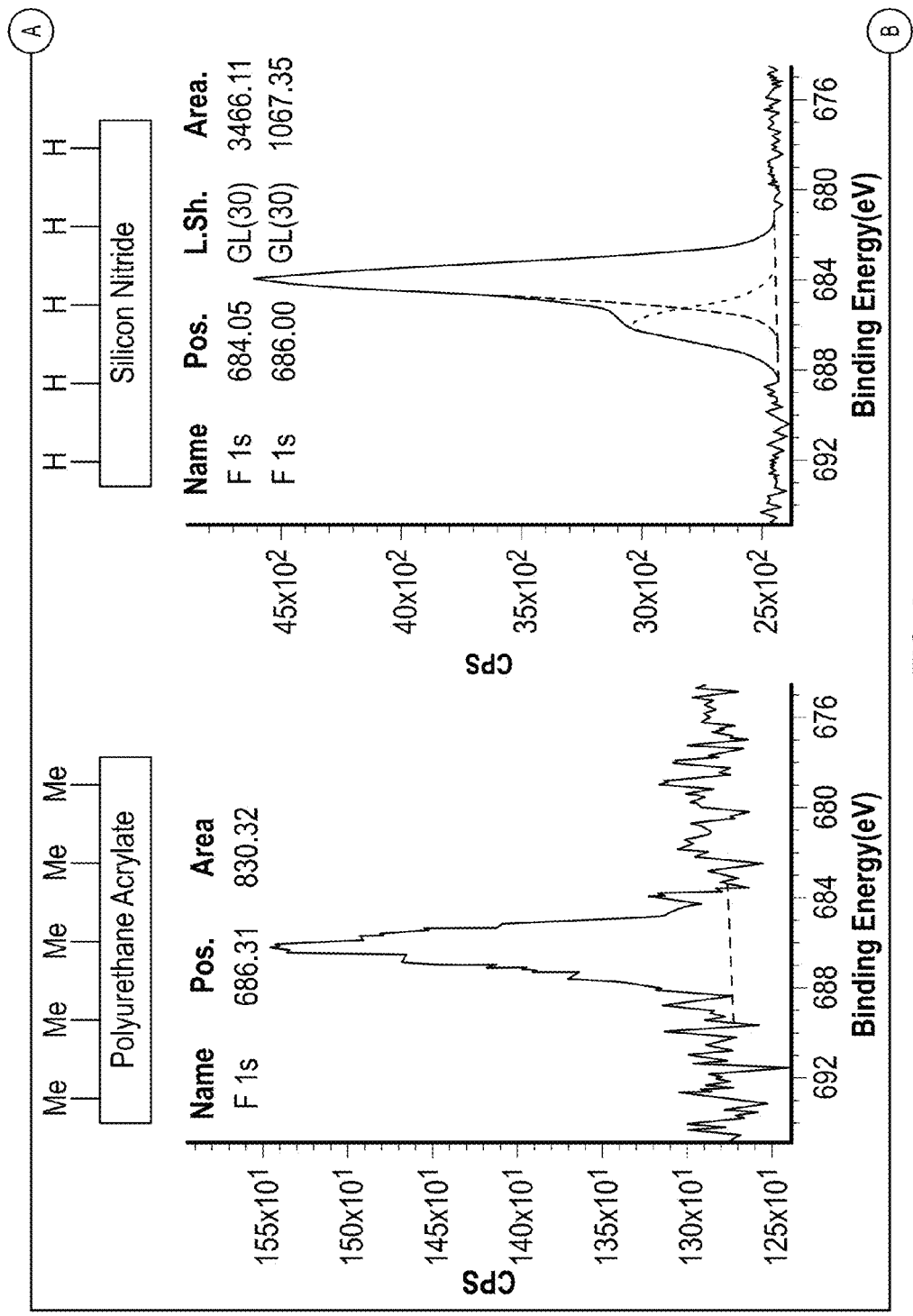
FIG. 3 is a set of graphs showing the F1s XPS signals and their calculated areas on polyurethane acrylate polymer, H-terminated silicon nitride, and methylated silicon modified with NHS-diazirine molecules via vapor-phase carbenylation (after rinsing with i-PrOH).
Figure 3:
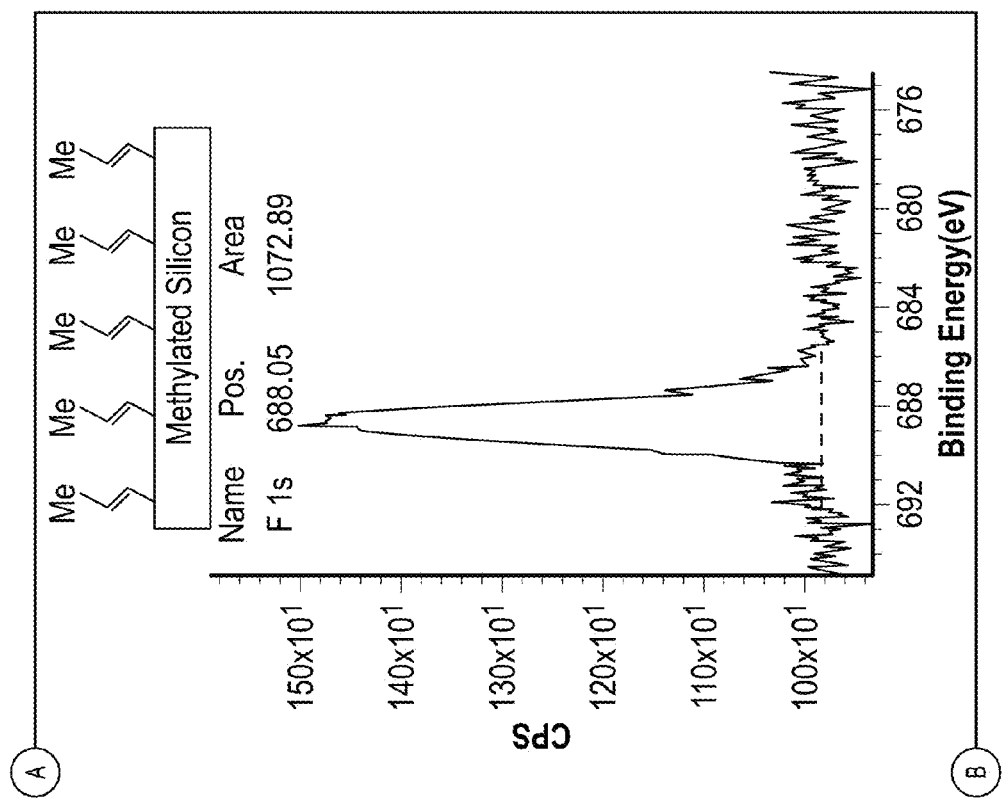

Functional diazirines were used to modify methylated and Si—H and C—H terminated surfaces via vapor-phase UV-catalyzed carbene insertion. Specifically, surfaces comprising methylated silicon, hydrogen-terminated silicon nitride, and inert polyurethane-acrylate polymer containing methylated molecules were functionalized with NHS-diazirine molecules. These reactions were performed in a simple bell jar deposition system by heating solid diazirines to 60° C. to establish an approximately ~10 mTorr vapor pressure. The substrates were positioned directly above the diazirine source. The 365 nm UV light was introduced through the side wall. To remove physisorbed molecules, following a 10 minute UV exposure, the substrates were either rinsed with carbon tetrachloride and isopropanol, or heated in vacuum (10 mTorr) to 60° C., or evacuated to $10^{-3}$ mTorr pressure. The deposited substrates were analyzed by XPS (FIG. 3). XPS analysis revealed that the vapor-phase reactions produce chemisorbed films that have the same molecular density as the solution-deposited monolayers (by comparing solution- and vapor-deposited monolayers on methylated silicon). It also revealed that the peak area of the F1s XPS signal from the diazirine molecule on all substrates after rinsing, heating or high vacuum exposure vary only by ~20% (polyurethane-acrylate has the lowest peak area due to the low concentration of the —CH₃ groups; silicon nitride surface also contains large F1s signal probably from the Si—F bonds at 684 eV). Substrates that were not treated to remove physisorbed layers showed significantly higher F1s concentrations (by 300-700%) and significantly reduced intensities of the surface specific atoms (suggesting formation of 10-20 nm multilayered films). These results show that vapor-phase molecular layer deposition of diazirines can be carried out on hard and soft interfaces, including rough and porous materials.

Example 2

Figure 5:
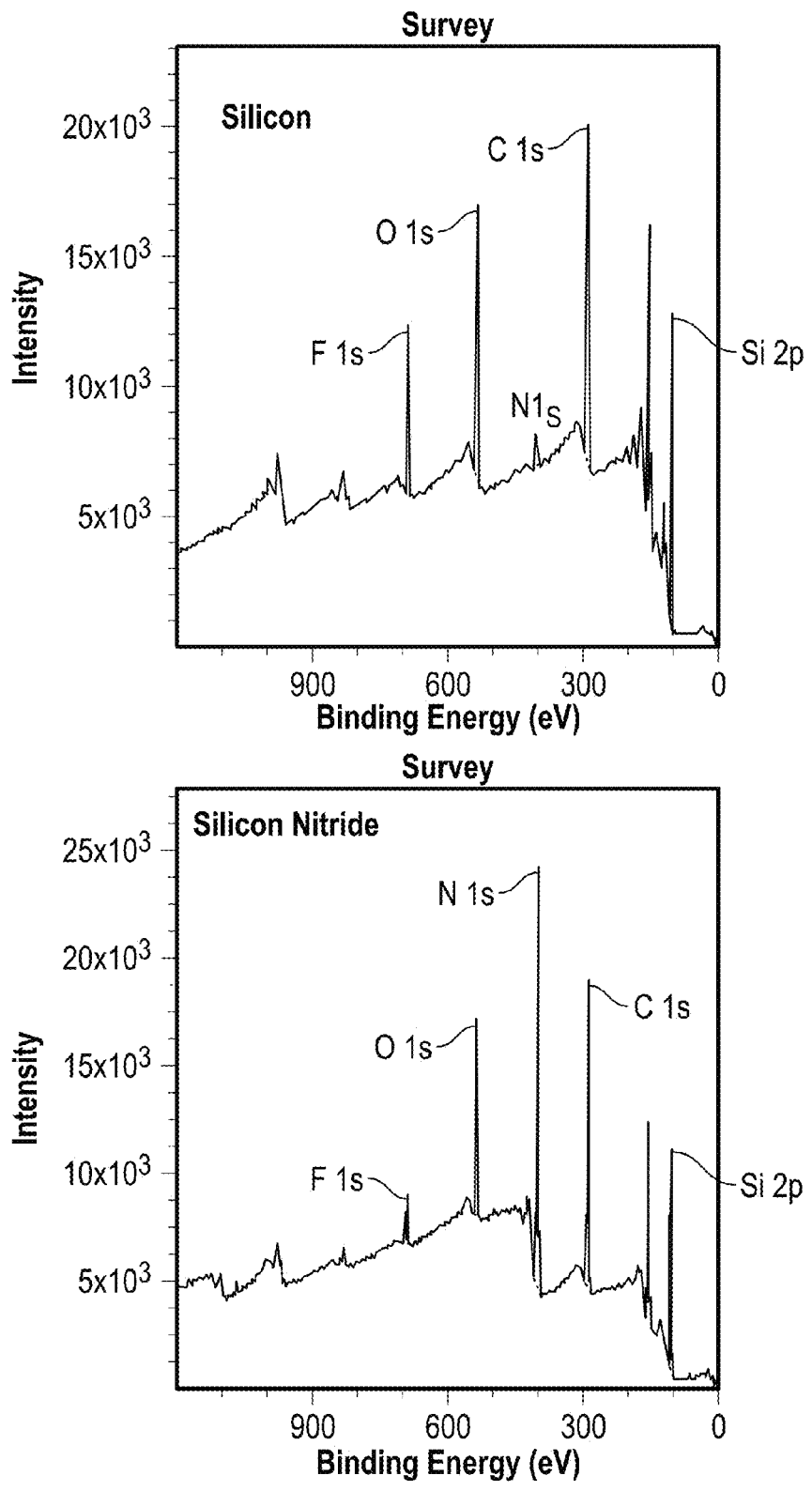
FIG. 5 are graphs showing XPS spectra of carbenylated interfaces for silicon, silicon nitride, and polyurethane-acrylate polymer (PUA). The graphs include survey scans; F1s scans; and C1s scans.
Figure 5:
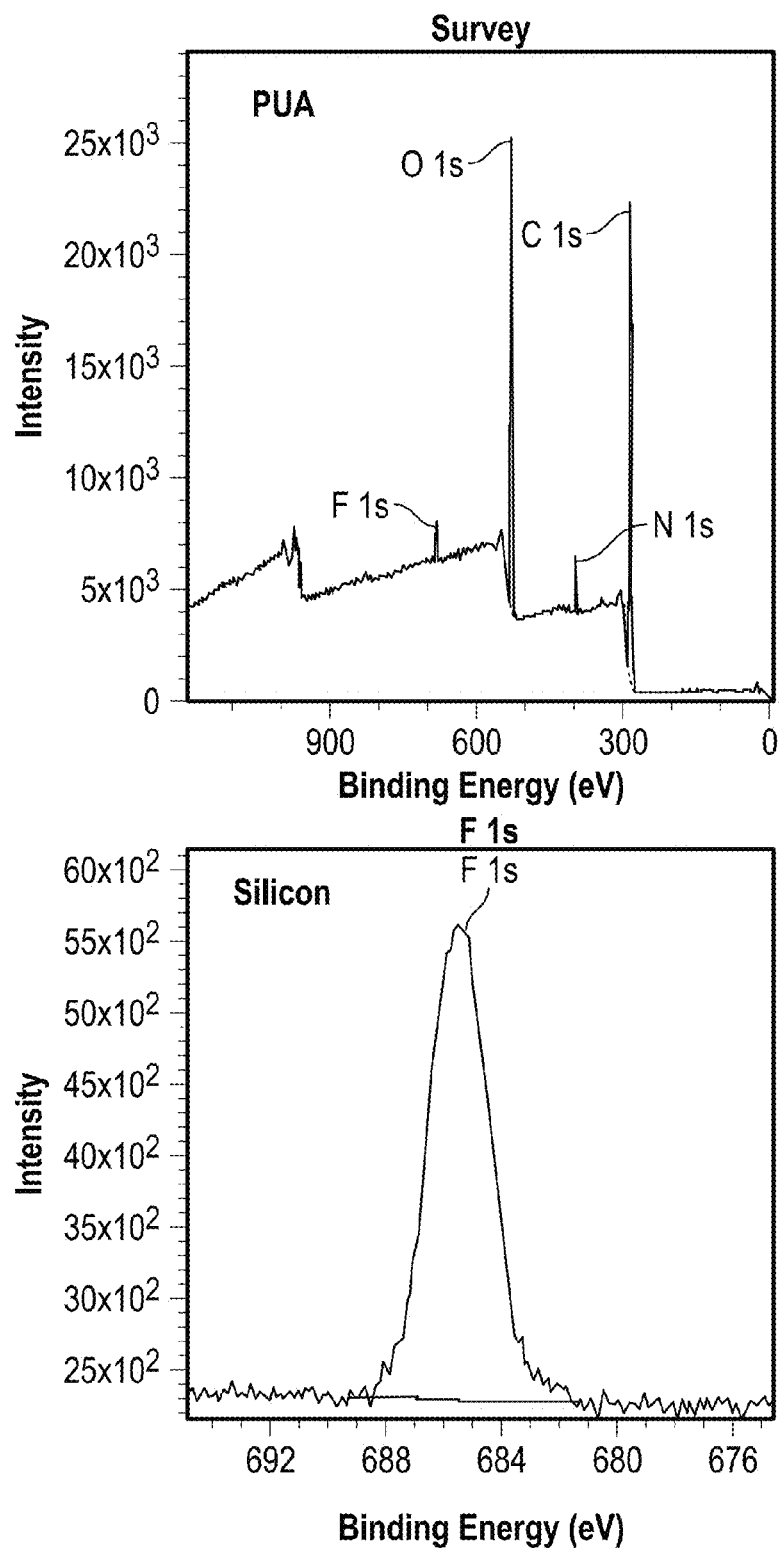
Figure 5:
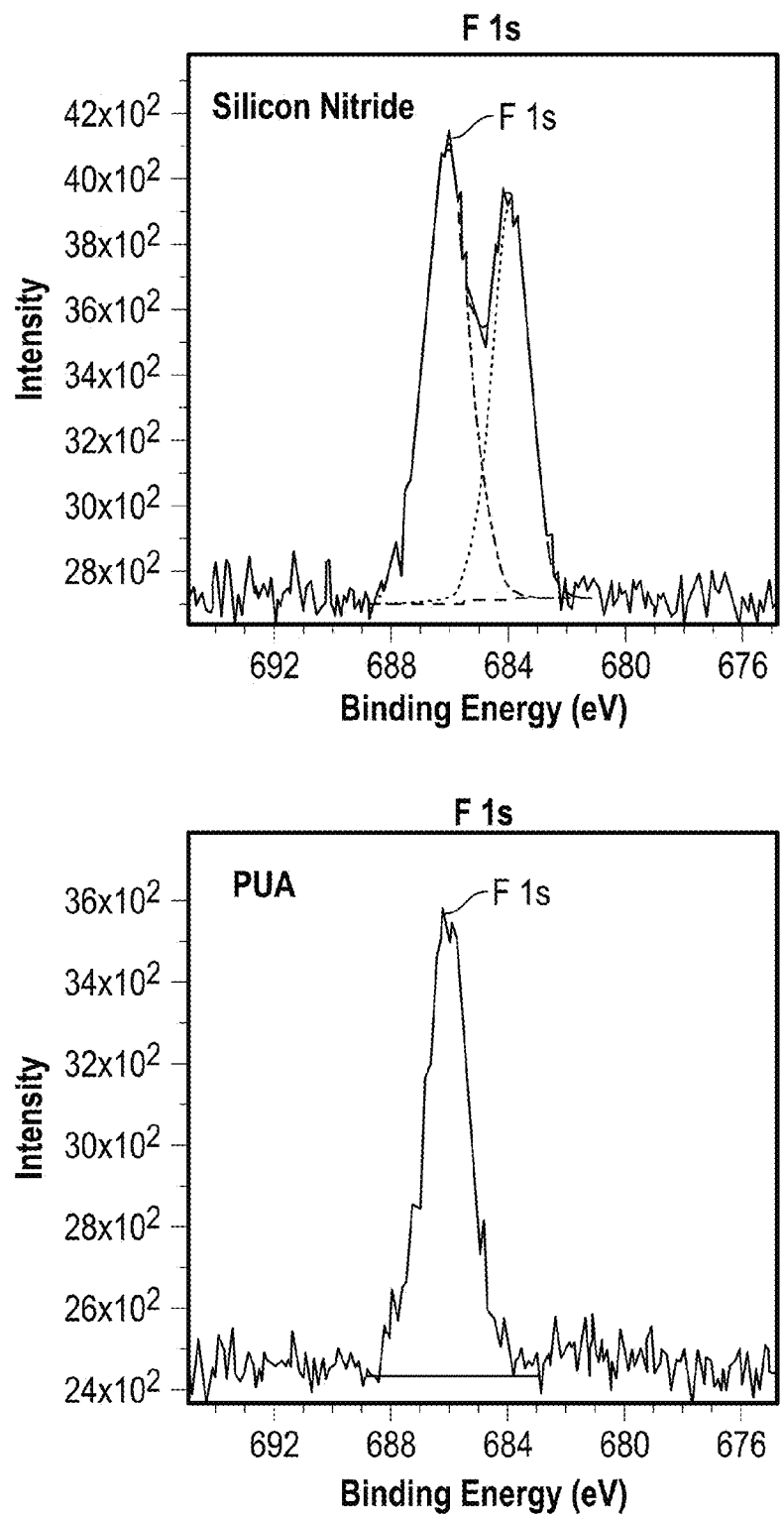
Figure 5:
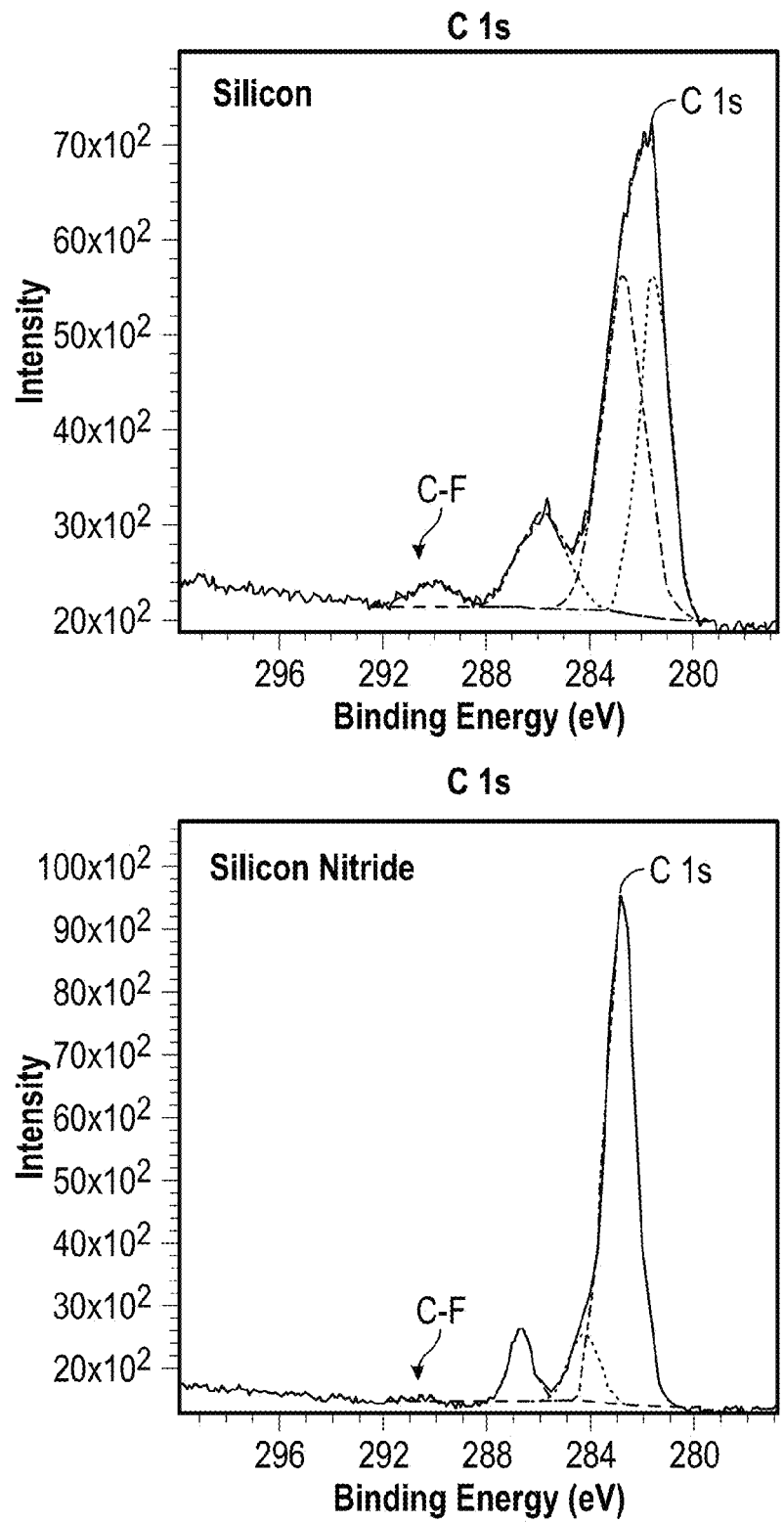
Figure 5:
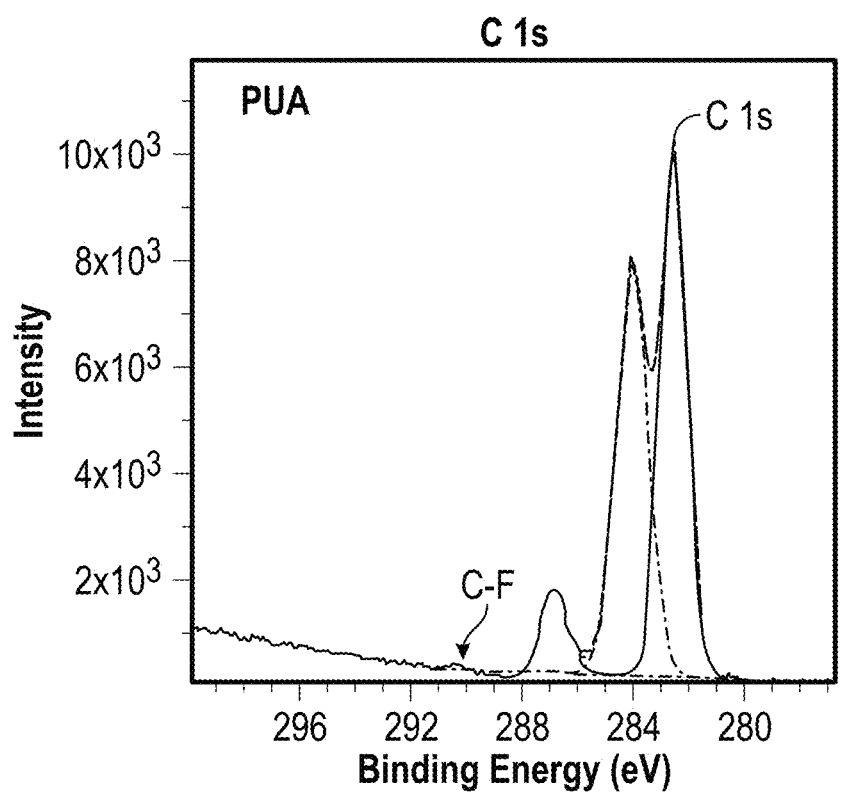

Functionalization Protocol (Silicon Nitride as an Example; FIG. 4):

Silicon nitride chips were cleaned in a nanostrip solution at 75° C. for 20 minutes, rinsed with water and reacted with diluted HF solution to create Si—H terminated interfaces. The chips were then placed into a glass vacuum chamber with a diazirine molecule in an aluminum source boat. The chamber was evacuated to 200 mTorr and the diazirine source was heated to 100-150° C. The UV light source (Hg lamp, 254 nm) was placed next to the reaction chamber at 1 cm distance. The chips were allowed to react with the diazirine vapors under the UV light for 1 hour. The chamber was then evacuated to ~2 mTorr or the chips were rinsed with isopropanol to produce a silicon nitride interface modified with carbene monolayers. XPS analysis and contact angle measurements were used to confirm molecular attachment (FIG. 5).

Functionalization of Nanostructured Surfaces:

Similar conditions as described for functionalizing silicon nitride chips were used to functionalize thin silicon nitride membranes supported on silicon chips. The membrane was a free-floating thin film of silicon nitride supported on a silicon template bearing an array of microscopic open windows. The average diameter of the pores in the membrane was ~40 nm and the average distance between the pores was ~250 nm (both parameters can be varied).

Silicon nitride membranes were cleaned in a nanostrip solution at 75° C. for 20 minutes, rinsed with water and reacted with diluted HF solution to create Si—H terminated interfaces. Or, silicon nitride membranes were cleaned with isopropanol and oxygen plasma and reacted with the vapors of trimethoxyalkylsilane and trimethylamine in vacuum at 75° C. for 14 hours and annealed in vacuum at 150° C. for 2 hours to create methylated silicon nitride interfaces. Si—H terminated or methylated chips were then placed into a glass vacuum chamber with a diazirine molecule in an aluminum source boat. The chamber was evacuated to 200 mTorr and the diazirine source was heated to 100–150° C. The UV light source (Hg lamp, 254 nm) was placed next to the reaction chamber at 1 cm distance. The chips were allowed to react with the diazirine vapors under the UV light for 1 hour. The chamber was then evacuated to ~2 mTorr or the chips were rinsed with isopropanol to produce a silicon nitride interface modified with carbene monolayers. XPS analysis and contact angle measurements were used to confirm molecular attachment (FIG. 5).

Surface Composition:

XPS analysis was used to confirm surface attachment of carbenes and formation of robust, covalently bound monolayers. FIG. 5 shows survey scans and high resolution region scans of C1s and F1s atoms of various surfaces modified with NHS-diazirine molecules. The results from the C1s region scans showed the presence of C—F bonds at 290 eV. This group is intrinsic to the NHS-diazirine used. The C—F peak was absent in C1s scans of surfaces before the carbene reactions, suggesting successful carbene attachment. The results from the F1s scans also demonstrated the presence of F atoms in the carbene modified substrates. The C—F peak was shown to be absent in all unreacted substrates, except for the silicon nitride treated with HF or BOE. The silicon nitride substrates modified with NHS-diazirine shows two distinctive F peaks that correspond to Si—F and C—F bonds. The unreacted silicon nitride shows a single set of F1s peak that corresponds to stable Si—F bonds formed after exposing silicon nitride to HF or BOE. Silicon nitride chips that were not rinsed or exposed to high vacuum after the reaction with NHS-diazirine, show significantly higher concentration of F1s and C1s atoms. After rinsing or high vacuum exposure of the carbene modified substrates, the concentration of both C1s and F1s atoms decreased, but are not eliminated. The rinsing treatment or high vacuum exposure of the carbene modified substrates appears to dissolve or evaporate physisorbed films leaving covalently attached monolayers intact.

Vapor phase deposition of carbene was used for functionalizing rough and nanostructured materials. Stable, non self-assembled monolayers were formed, whose stability is not affected by the surface roughness. This method is suitable for processing and large-scale deposition of monolayers on complex three-dimensional substrates. The differences in C1s and F1s atomic concentrations between flat silicon nitride chips and silicon nitride membranes functionalized with NHS-diazirine molecule were not significant (FIG. 5).

This example demonstrates that vapor-based carbenylation can be used to modify surfaces of inorganic and organic materials, including (a) hydrogen-terminated silicon and silicon nitride, (b) oxide free silicon modified with ultra-thin propenyl monolayers, (c) conductive indium tin oxide modified with long-chain aliphatic self-assembled monolayers, and (d) polyurethane-acrylate polymers containing —CH$_3$ groups. In case of silicon nitride, the reaction was demonstrated on both, flat silicon nitride and silicon nitride membranes containing dense arrays of ~30-40 nm pores (FIG. 4). Considering that practically any inorganic surface can be functionalized with thin methylated films or monolayers, this approach can be extended to a much greater variety of interfaces. It can also be used to functionalize thin films of small organic molecules containing —CH$_3$ groups.

Figure 6:
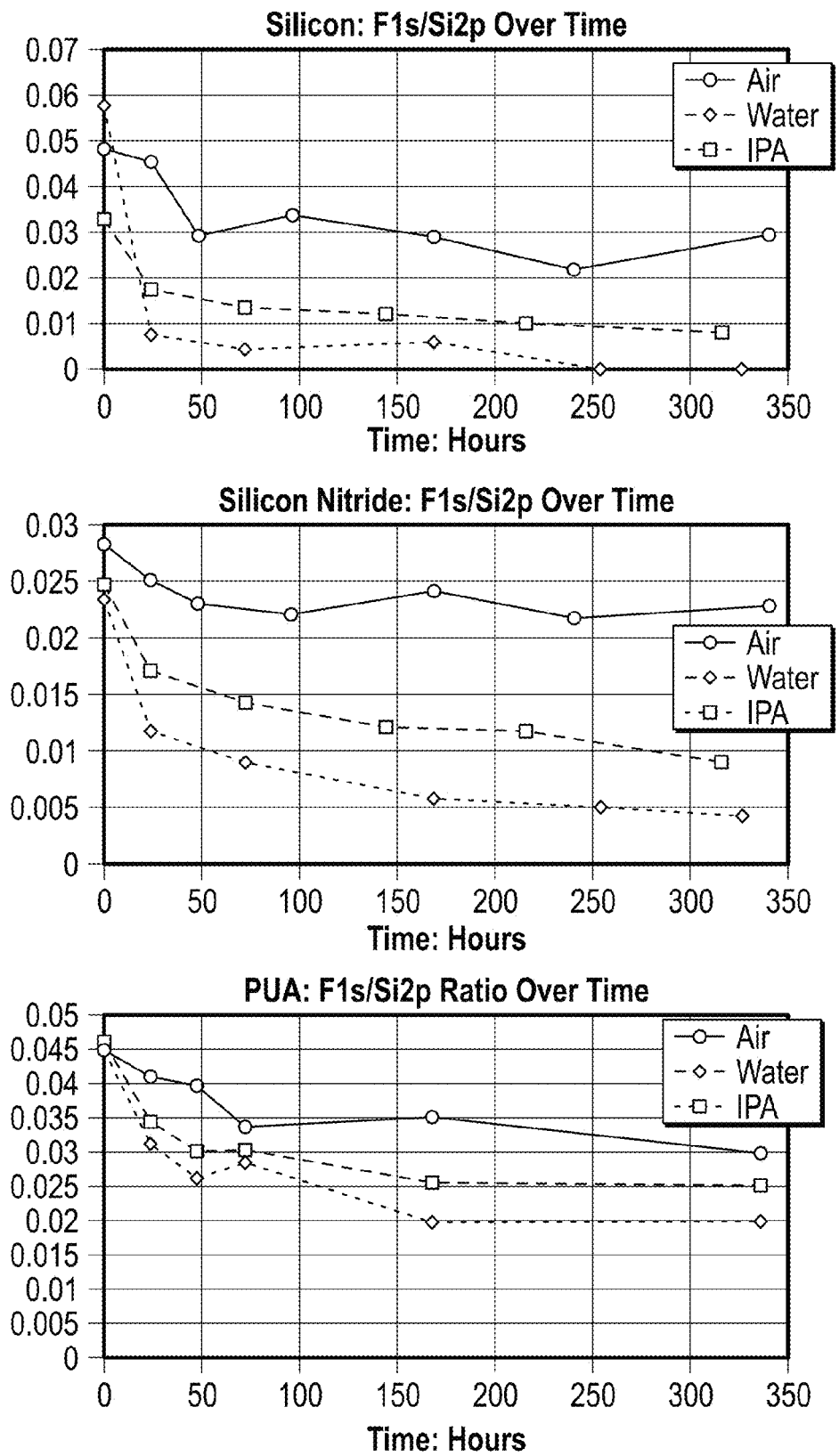
FIG. 6 are graphs showing normalized F1s XPS signals as a function of time and exposure conditions. Top: silicon nitride; Middle: silicon; Bottom: PUA.

Stability of Carbene Interfaces:

FIG. 6 shows normalized F1s XPS signals of diazirine-modified silicon nitride, silicon and polyurethane-acrylate polymer as a function of time and exposure to isopropanol and water. The surface atoms signals decrease over time. This is due to non-specifically adsorb adventurous molecules from the atmosphere or solutions to the substrate surface, thus leading to the decrease in intensities of indigenous surface atoms. Silicon demonstrated good stability when exposed to air or isopropanol (IPA) for up to 3 days, however a weeklong exposure to water caused monolayer desorption. Both pure silicon nitride and polyurethane-acrylate polymer demonstrated much better stability in water and IPA then silicon. F1s signals of diazirine molecules were detected in both of these samples even after a weeklong exposure to water and IPA. Considering that the NHS-diazirine molecule is not centrosymmetric and its monolayers cannot function as self-assembled diffusion barriers, these results confirm high stability of both Si—C and CH$_2$—C surface bonds.

Figure 7:
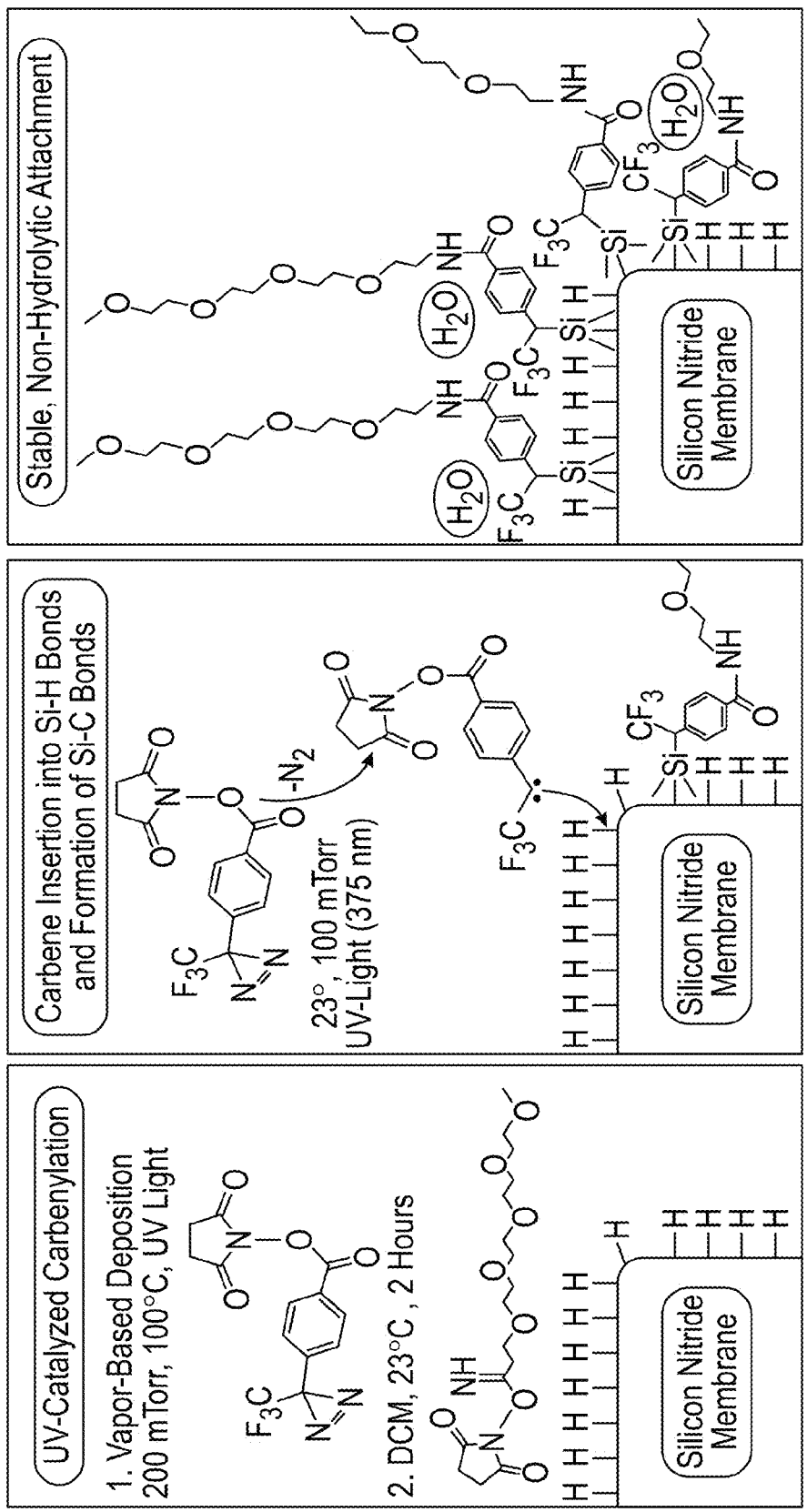
FIG. 7 are schematic diagrams showing a general approach towards functionalization of silicon nitride membrane with non-fouling monomolecular coatings.

Non-Fouling Performance of Silicon Nitride Membranes Functionalized Via Carbene Insertion:

A thin molecular system that can be used to functionalize nano-porous silicon nitride membranes for the use in hemodialysis was created. It is preferable that the molecular system is stable in aqueous environments, its total thickness less than 10 nm to prevent pore clogging, and it can serve as barrier to non-specific adsorption of biomolecules and living cells. Specifically, NHS-diazirine molecules were used to functionalize the membrane with a stable monolayer of NHS-reactive molecules. This monolayer was then exposed to a polyethylene glycol (PEG) molecule modified on one end with a free amino group (FIG. 7).

Figure 8:
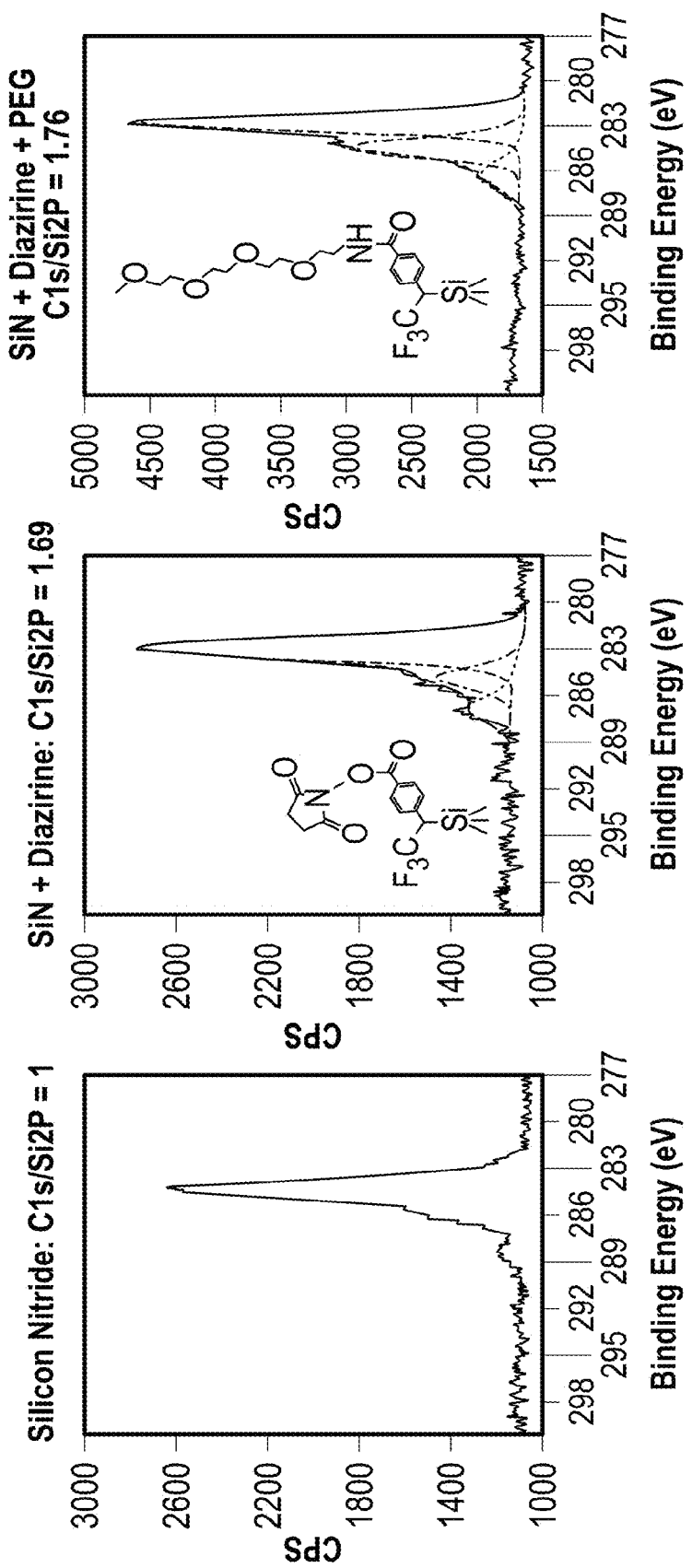
FIG. 8 are graphs showing C1s XPS scans of pure silicon nitride, silicon nitride carbenylated with NHS-diazirine, and NHS interface reacted with PEG-amine.

XPS analysis confirmed successful attachment of NHS-diazirines and PEG molecules (FIG. 8). FIG. 6 demonstrates that high-resolution C1s scans of the monolayers contain characteristic components of C—F and C—O bonds (in addition to C—C peaks). The ratio of C—O peaks increased significantly after the reaction of PEG-amine with surface-immobilized NHS group, suggesting successful attachment of PEG molecules.

Figure 9:
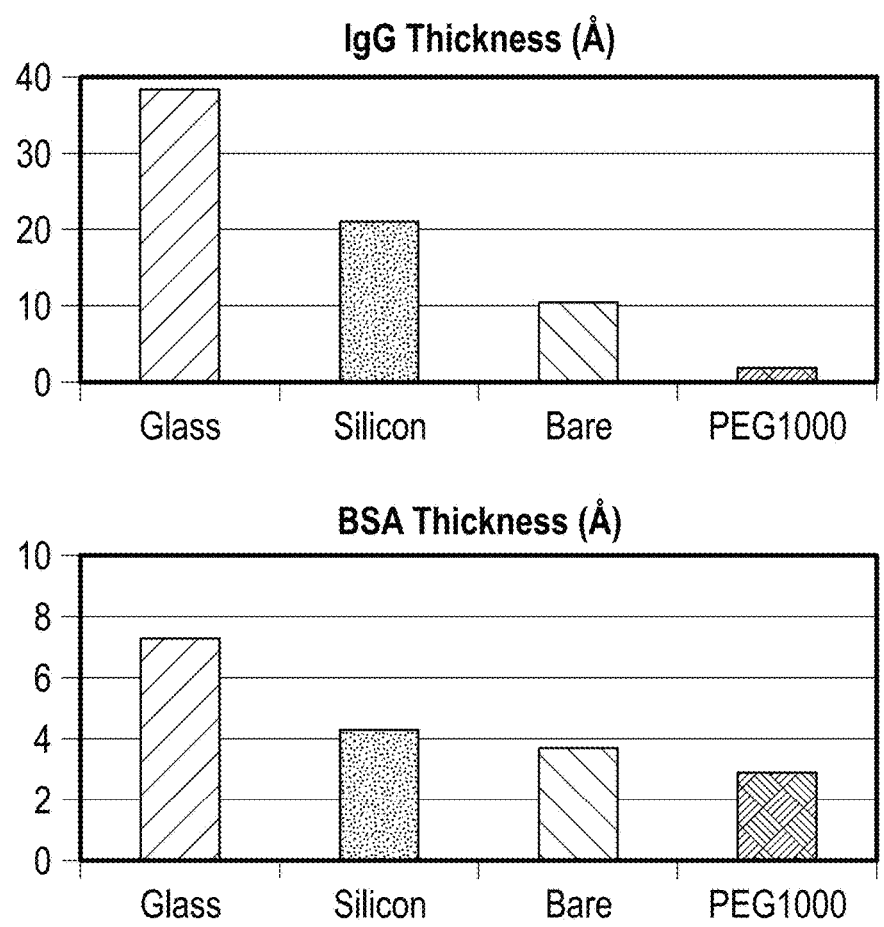
FIG. 9 are bar graphs showing changes in the thickness layer of IgG (top) and BSA (bottom) proteins on various membranes.

The levels of IgG and BSA adsorption on the controlled chips and chips modified with the diazirine and PEG molecules were determined (FIG. 9). Diazirine-PEG-modified interfaces demonstrated reduced IgG and BSA adsorption levels when compared to control glass chips. The overall thicknesses of the adsorbed protein layers were 2-3 Å (sub-nanometer).

Throughout this application, various publications are referenced. The disclosures of these publications in their entireties are hereby incorporated by reference into this application in order to more fully describe the state of the art to which this invention pertains.

It will be apparent to those skilled in the art that various modifications and variations can be made in the present invention without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for depositing a monolayer onto a surface of a substrate, comprising:
    (a) contacting the surface with a vapor phase under vacuum, wherein the vapor phase comprises a carbene source, and
    (b) generating a carbene group from the carbene source by irradiating the carbene source with UV light, whereby the carbene group reacts with the surface to obtain a covalently bound monolayer on the surface of the substrate, wherein the reaction with the surface is free or comprises less than 0.5% by weight of a solvent.

2. The method of claim 1, wherein the carbene source is a carbene precursor.

3. The method of claim 2, wherein the method further comprises irradiating the carbene precursor to generate the carbene group from the carbene precursor.

4. The method of claim 2, wherein the carbene precursor is represented by the formula:

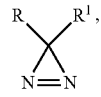

wherein

R is $C_1$-$C_6$ alkyl, $C_1$-$C_6$ alkylhalide, substituted or unsubstituted aryl, substituted or unsubstituted heteroaryl, $C_1$-$C_6$ alkoxyl, aryloxyl, amino, amido, substituted or unsubstituted cycloalkyl, substituted or unsubstituted heterocycloalkyl, cyano, cyanato, ester, hydro, halo, thiocyanato, nitro, nitroso, sulfo, sulfonato, thio, boryl, borono, phosphono, phosphonato, phosphinato, phospho, phosphino, silyl, or siloxyl; and $R^1$ is $C_1$-$C_6$ alkylhalide, substituted or unsubstituted aryl, substituted or unsubstituted heteroaryl, $C_1$-$C_6$ alkoxyl, aryloxyl, amino, amido, substituted or unsubstituted cycloalkyl, substituted or unsubstituted heterocycloalkyl, cyano, cyanato, ester, hydro, halo, thiocyanato, nitro, nitroso, sulfo, sulfonato, thio, boryl, borono, phosphono, phosphonato, phosphinato, phospho, phosphino, silyl, or siloxyl;

wherein when R or $R^1$ is chosen from a substituted substituent it is substituted with sulfonic acid, sulfonate, amino, amido, alkyl, alkenyl, alkynyl, alkoxyl, aryl, carbonyl, carboxylate, carbamyl, cyano, ester, halogen, heteroaryl, hydroxyl, nitrile, nitro, sulfinyl, sulfanyl, or thiol.

5. The method of claim 4, wherein R is halo, methyl, or a trihalomethyl; and $R^1$ is a substituted or unsubstituted aryl or a substituted or unsubstituted heteroaryl.

6. The method of claim 1, wherein the surface comprises a functional group selected from a C—H, Si—H, $NH_2$, OH, SH, and combinations thereof, and the carbene reacts with the functional group.

7. The method of claim 6, wherein the functional group is coated onto the surface of the substrate as a film.

8. The method of claim 1, wherein the surface of the substrate comprises an organic material, an inorganic material, or combinations thereof.

9. The method of claim 8, wherein the organic material comprises a small molecule, a polymer selected from the group consisting of polyolefins, polyesters, polyamides, polystyrenics, polytetrafluoroethylene, polyglycosides, polypeptides, polyacrylates, polyacrylics, polycarbonates, polyethers, polyketones, rubbers, polysulfones, polyurethanes, polyvinyls, polysaccharides, polysilanes, polysiloxanes, polydimethyl silanes, or combinations thereof.

10. The method of claim 8, wherein the organic material comprises an organic semiconductive polymer or an organic semiconductive small molecule.

11. The method of claim 8, wherein the inorganic material comprises a group II, III, IV, or V semiconductor.

12. The method of claim 8, wherein the inorganic material comprises silicon, silicon nitride, silicon oxinitride, alumina, titania, glass, an allotrope of carbon, indium-tin-oxide, methylated silicon, or combinations thereof.

13. The method of claim 1, wherein the vapor phase is at a vapor pressure of from about $10^{-2}$ to about $10^{-9}$ Torr.

14. The method of claim 1, further comprising removing any physisorbed molecules from the surface of the substrate.

15. The method of claim 1, further comprising reacting the covalently bound monolayer with a polymeric group.

16. The method of claim 15, wherein the polymeric group is a modified polyethylene glycol group.

17. The method of claim 1, wherein the carbene source comprises an ester, an amide, a succinimide, or a carbamate functional group.

18. A method for depositing a mixed-monolayer onto a surface of a substrate comprising,
    (a) contacting the surface with a mixed vapor phase under vacuum, wherein the mixed vapor phase comprises two or more different carbene sources;
    (b) generating two or more carbene groups from the two or more carbene sources by irradiating the carbene source with UV light; whereby the carbene group reacts with the surface to obtain a covalently bound mixed-monolayer on the surface of the substrate, wherein the reaction with the surface is free or comprises less than 0.5% by weight of a solvent.

19. The method of claim 18, wherein the method comprises two carbene sources.

20. The method of claim 18, wherein the two or more carbene sources are at different temperatures.

21. The method of claim 18, wherein a carrier gas is used to contact the surface with the mixed vapor phase.

22. The method of claim 18, wherein the two carbene sources are in a ratio of from 1:10 to 1:1000.

* * * * *